Figure 1:
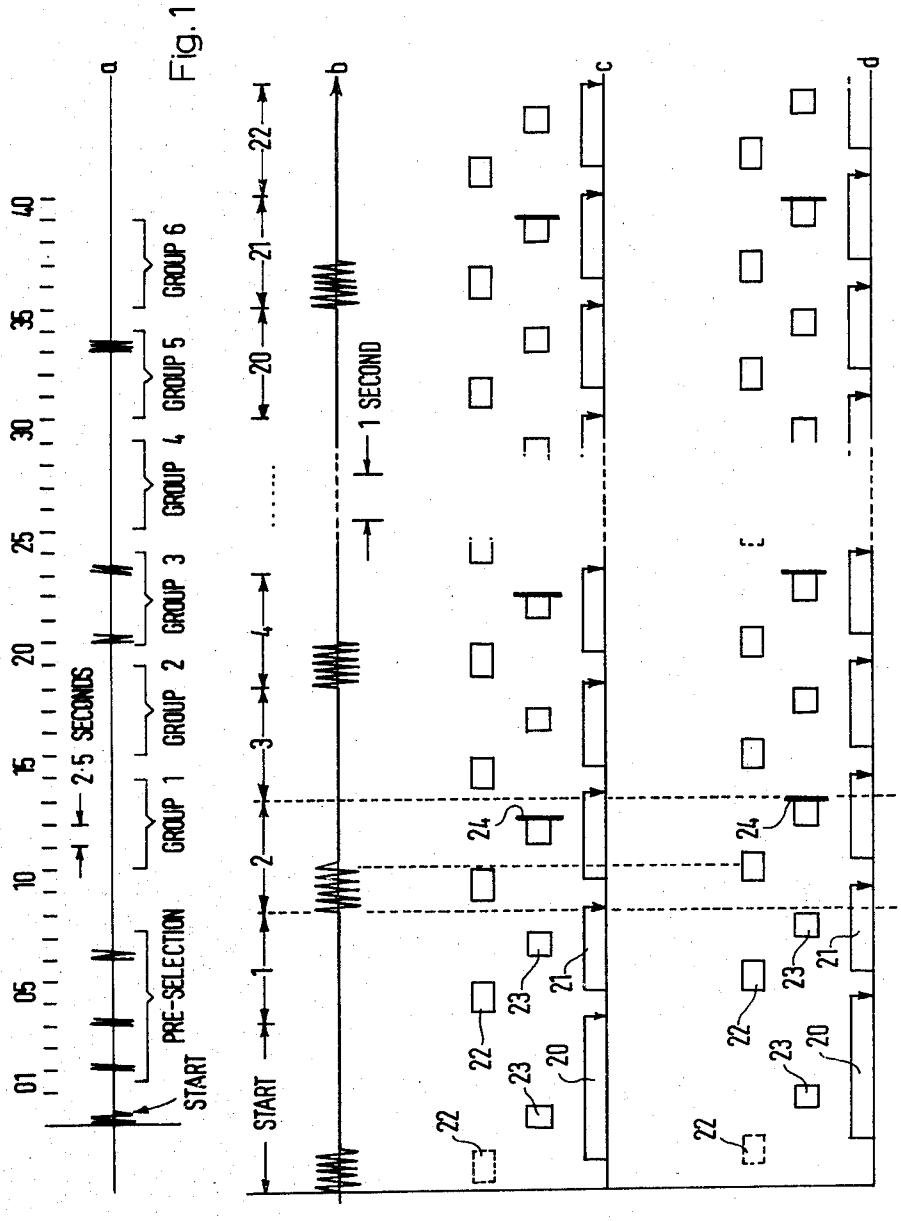

REMOTELY-CONTROLLABLE RELAYS AND FILTERS THEREFOR

This invention relates to remotely-controllable relays for effecting a switching operation in response to a control signal in the form of an alternating ripple voltage at a predetermined frequency superimposed upon an alternating power supply voltage in an electric-power distribution network, and to filters for use in these relays.

Such relays, commonly known as ripple-control relays, are used in centralized remote-control applications, to allow the remote control of equipment by the transmission from a central station of trains of coded pulses each represented by a burst of ripple voltage superimposed on the supply voltage. The coding of these pulses is arranged to provide selective control of the remote equipment.

Before the control can be effected, it is necessary to extract the ripple voltage from the network voltage (comprising supply voltage plus ripple voltage). The pulses represented by the ripple voltage are detected and then decoded, for example, as a function of the position of a pulse in the pulse train, relative to a first (starting) pulse.

In known ripple-control relays the separation of the ripple voltage pulses from the supply voltage has been accomplished by filtering at the ripple-voltage frequency. The supply voltage frequency is typically 50 Hz, and the ripple-voltage frequency is typically 175 Hz. The filters must have a passband capble of distinguishing the voltage-signal at this ripple frequency, of relatively low amplitude, from the supply-frequency voltage and its harmonics, which are much larger in amplitude. An example of the type of bandpass filter which has been used is shown in British Pat. No. 1,434,037, and comprises an LC series-resonant circuit and a vibrating reed in series with one another and both tuned to 175 Hz. The signal is applied to the reed and extracted from it by respective piezo-electric transducers bonded to the reed.

This type of filter is delicate and expensive. It requires careful adjustment to obtain accurate setting of the desired tuned frequency, and this setting is sensitive to temperature changes. Furthermore, the filter is unsuitable for incorporation in a monolithic integrated circuit.

In detecting the pulses, it is necessary to guard against noise and spurious pulses in the supply system being mistaken for control pulses. At the same time, it is desirable to avoid rejection of authentic control pulses which are for some reason lacking some cycles of the ripple-voltage frequency. Circuitry for satisfying these requirements is also described in the above-mentioned British Patent Specification, but is rather complex.

Another known system for separating the pulses from the supply voltage involves a correlation technique of multiplying the network voltage separately by two signals generated at a frequency equal to the nominal frequency of the ripple voltage and in phase quadrature with one another. The two product signals, each comprising essentially an alternating signal at the ripple frequency superimposed on a d.c. signal, are filtered to select the d.c. signals. These two d.c. signals have in the past been combined in a root-of-sum-of-square circuit to permit accurate detection of the ripple signal. This system is also complex and the root-of-sum-of-squares circuitry in particular requires careful adjustment.

It is an object of this invention to provide a remotely-controllable relay which is suitable for implementation in integrated-circuit form, which avoids the need for accurate and selective filtering of the ripple-voltage frequency, and which permits simplified detection.

According to one aspect of this invention there is provided a remotely-controllable relay for effecting a switching operation in response to a control signal in the form of an alternating ripple voltage at a first predetermined frequency superimposed upon an alternating power supply voltage in an electric-power distribution network, comprising:

an input for receiving the network voltage and supplying a signal derived therefrom;

means for generating a signal at a second predetermined frequency different from the first frequency and selected such that the difference frequency of the first and second frequencies is less than any of the first, second and power supply frequencies;

means connected to receive and mix said second-frequency signal and said signal suppplied by the input, whereby to produce an output signal including, if said control signal is present on the network, a component at the difference frequency;

filter means connected to receive the output signal of the mixing means, and arranged to pass said difference frequency and to attenuate higher frequencies; and means connected to the filter means to detect the presence of said component and to effect said switching operation in accordance therewith.

The frequency shift (from said first frequency to said difference frequency) introduced by the mixing increases the frequency ratio between the ripple-voltage signal and the power supply voltage, thereby facilitating the filtering of the control signal and rendering inessential a bandpass filter accurately tuned to the ripple-voltage frequency. Furthermore, since the second predetermined frequency is chosen to be different from the first (ripple voltage) frequency, the circuit is inherently relatively insensitive to small drifts in the ripple voltage frequency, and the need to provide the various possible phase relationships between the ripple voltage and a reference signal at the same frequency, which arises in correlation filters for example, can be circumvented.

The filter means may comprise a low-pass filter which substantially blocks all frequencies (including the first, second and power supply frequencies) above the said difference frequency, and may for example be a third-order active filter.

The input may include a band-pass filter arranged to attenuate the power supply frequency and at least the odd harmonics thereof relative to said first predetermined frequency.

The mixing means may comprise multiplying means between said input and said filter means, connected to receive and multiply together said second frequency signal and said signal supplied by the input, in which case the multiplying means may comprise switch means coupling said input and said filter means, and responsive to said second-frequency signal to open and close once during each cycle of said signal.

In some cases it may be advantageous to provide additional filtering before, or in combination with, the mixing of the second-frequency signal and the signal supplied by the input. For example, the mixing means motely by control signals transmitted through the 50 Hz electric-power distribution network. These signals comprise pulses each represented by a burst of 175 Hz ripple voltage superimposed on the supply frequency, each burst being one second in duration. The circuit is arranged to detect such pulses occurring in any one of forty successive one-second time-slots which are spaced from one another by an interval of one and a half seconds. A pulse is present in any particular time-slot only if it is desired to send a common represented by that time-slot. The starting point from which the forty time-slots are counted is determined by a one-second "starting pulse" sent two and three-quarter seconds before the first time-slot. When the circuit detects this starting pulse, it waits for two and three-quarter seconds, then tests for the possible presence of the first one-second pulse, waits one and a half seconds, tests for the second possible pulse, waits and so on for the whole train of forty possible pulses that could be sent.

Each relay in a complete system is preset to control the operation of its two relay units in accordance only with pulses in selected groups within the forty time-slots. The relay units may be operated together by the same pulses; or independently by different pulses in the same group or in different groups. Furthermore, the relays may be arranged so that pulses in the first seven time-slots in a set of forty do not directly control operation of the relay units in each relay, but rather preselect which relays will respond to pulses in the subsequent time-slots in that set. In this latter case, operation of a relay unit requires two pulses; one to preselect the relay containing that unit, and another in one of the subsequent time-slots to which that relay is preset to respond. A typical train of pulses for this preselection mode of operation is shown in FIG. 1*a*, with the 50 Hz power supply voltage omitted for clarity.

In a system using the preselection mode of operation, the seven preselection time-slots are followed by three unused time-slots, and the remaining thirty time-slots are notionally divided into six groups of five each, whereas without preselection there would be eight groups of five time-slots each. Only the first four time-slots in each group are used: the contacts of a first of the relay units are closed and opened respectively by pulses in the first and second time-slots; the contacts of the second relay unit are closed and opened respectively either by pulses in the first and second time-slots (that is, simultaneously with operation of the contacts of the first relay unit) or by pulses in the third and fourth time-slots (that is, independently of operation of the first relay unit).

Preselection is controlled by presetting the relay with a binary number from 001 to 111, thus identifying one of the first to seventh time-slots in which a pulse must occur before the relay can respond to a control-signal pulse in the remainder of the set of forty time-slots. However, the relay may also be preset to 000, in which case the preselection is overridden, and the relay implements the command represented by any pulse in the appropriate one of the six groups of time-slots in every pulse-train, irrespective of the presence or absence of the preselection pulses.

The 175 Hz ripple voltage defining the control-signal and starting pulses is sensed indirectly. First it is shifted down to a very low frequency, and then the amplitude of this low frequency signal is sensed by comparing the signal magnitude with fixed positive and negative reference voltages. A total of three successive crossings of these two voltages alternately (that is, +, −, +, or −, +, −) suffices for detection of a pulse. In the case of a starting pulse, the first of these three crossings also triggers the start of a timebase signal which co-ordinates the inspection for the presence or absence of each of the forty possible control-signal pulses.

Figure 2:
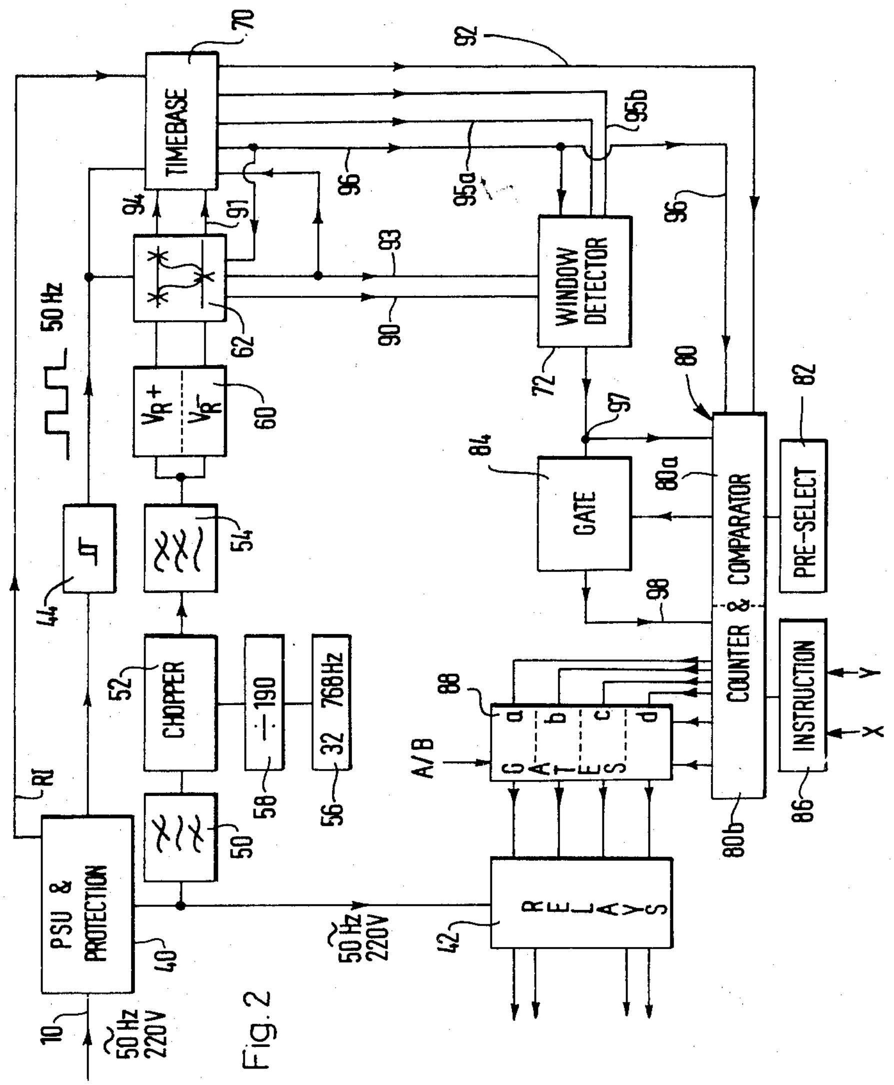

The general arrangement of the various parts of the relay for providing these functions is shown in FIG. 2.

Referring to FIG. 2, the 50 Hz electric-power distribution network is coupled to an input terminal 10 of a power supply and protection unit 40. This unit 40 derives from the mains supply the energizing voltages for operation of the rest of the relay, after filtering to block over-voltages and transients which occur on power supply networks and could cause damage to, or spurious operation of, the circuit. In particular, the unit 40 provides an a.c. supply at 220 V to energize the relay units in a relay circuit 42, and a low voltage 50 Hz (nominal) signal to a trigger circuit 44 which generates therefrom a clock signal at the frequency of the mains supply. The unit 40 also provides an 11V d.c. supply for the electronic components of the circuit, but the interconnections for this have been omitted from the drawings for the sake of clarity.

The 220 V supply for the relay circuit 42 (being essentially the mains supply filtered to protect the circuit as described above) is also coupled to a band-pass filter 50 forming the input to the circuitry for extracting and detecting the 175 Hz ripple signal. The band-pass filter 50 attenuates the amplitude of the 50 Hz mains supply relative to the 175 Hz signal to prevent saturation of following high-sensitivity circuits, and also attenuates the high-order, odd (particularly 11th, 13th) harmonics of the 50 Hz supply, for reasons which will be explained hereinafter.

The circuitry for extracting the ripple signal comprises a chopper 52 and a low-pass filter 54. The chopper 52 switches between conducting and non-conducting states in response to pulses supplied by an oscillator 56 via a divider 58. The oscillator frequency and the division ratio are chosen to give a chopping frequency close, but not equal, to 175 Hz. The output spectrum of the chopper 52 includes a beat signal at the difference frequency between the chopping frequency and the ripple frequency, corresponding to the ripple voltage signal down-shifted to a very low frequency (2 to 3 Hz). The low-pass filter 54 is tuned to pass this very low frequency, and exclude higher frequencies, including the power supply frequency, the ripple voltage frequency and the chopping frequency.

The output signal of the low-pass filter 54, comprising a 2–3 Hz oscillation occurring as and when there is 175 Hz ripple on the mains supply, is passed to a dual comparator 60 and a sequence gate 62 which together perform the amplitude-monitoring and crossing detection referred to earlier. The dual comparator 60 compares the instantaneous magnitude of the low-frequency beat signal with positive and negative threshold voltages, and generates respective output signals when the beat signal magnitude exceeds either of these threshold voltages. These output signals and their sequence are monitored by the sequence gate 62, which supplies a detection signal on a line 90 if there are three crossings of the reference voltages, as indicated by the output signals of the comparator 60, in the sequence +, −, +, or −, +, −, within a period of predetermined duration (960 milliseconds).

The generation of a detection signal is indicative that 175 Hz ripple of duration sufficient to constitute a starting or control-signal pulse is present on the distribution network.

In the case of a starting pulse (that is, when the circuit is quiescent and not already in the process of receiving and decoding control-signal pulses), the occurrence of the first crossing of one of the reference voltages causes the sequence gate 62 to supply a signal on a line 91 to trigger a timebase circuit 70. Provided a corresponding detection signal is subsequently generated by the sequence gate 62, this timebase circuit 70 then proceeds to generate a first timebase pulse (referenced 20 in FIG. 1*c*), which starts after a fixed delay of 640 milliseconds and terminates after another 3.2 seconds, followed by further timebase pulses 21, which terminate after further intervals of 2.5 seconds each. The falling edge of each of these pulses 20, 21 marks the approximate timing of each possible control-signal pulse superimposed on the 50 Hz mains supply, and co-ordinates the operation of a counter and comparator 80 which receives the timebase pulses 20, 21 via a line 92.

At the start of each timebase pulse 20, 21, the timebase circuit 70 also provides a command window-pulse 22, and, later, a check window-pulse 23. These window-pulses are supplied on lines 95*a* and 95*b* respectively to a window detector 72, which also receives, from the sequence gate 62, the detection signals on the line 90 and a signal on a line 93 indicative of any beat signal whose magnitude exceeds either of the threshold voltages. The window detector 72 operates to accept any detection signal occurring during a command window-pulse 22, (except the pulse 22 corresponding to the starting timebase pulse 20) and to check for the absence of all 175 Hz ripple between control-signal time-slots. The timings and durations of the window-pulses 22 and 23 are chosen to ensure that control-signal pulses (as represented by the corresponding detection signals) are properly received for subsequent implementation of the corresponding command, but that spurious 175 Hz ripple of incorrect timing or duration (resulting, for example, from a fault) is recognized as such and not treated as genuine starting or control-signal pulses.

The checking of starting pulses differs from that for control-signal pulses. In the case of control-signal pulses, the window detector 72 inspects the line 90 for a detection signal during each command window-pulse 22: the absence of a detection signal is merely indicative that no control signal pulse was transmitted during the relevant time-slot, and the window detector 72 then awaits the next command window-pulse 22. If 175 Hz ripple is detected during a check window-pulse 23 after a control-signal time-slot, any detection signal generated during that time-slot is simply suppressed, and the window detector 72 again awaits the following command window-pulse 22.

However, for a starting pulse, the operation of the window detector 72 is inhibited, and the corresponding command window-pulse 22 is not used and therefore shown in dashed lines in FIG. 1. Instead, and as noted earlier, the first crossing of one of the reference voltages by the 2-3 Hz beat signal triggers the timebase circuit 70; but if this is not followed within the 960-millisecond period starting with that crossing, by the appropriately-sensed second and third crossings, the sequence gate 62 supplies another signal, on a line 94, to the timebase circuit 70 to arrest its operation again. Furthermore, as shown in FIG. 2, the line 93 is coupled to the timebase circuit 70 as well as to the window detector 72, and if a signal indicative of the presence of 175 Hz ripple appears on the line 93 while the timebase circuit 70 is generating the first check window-pulse 23 (on the line 95*b*), the timebase circuit 70 responds by arresting its own operation. Thus, if, for example, either a very short burst of 175 Hz ripple occurs, or 175 Hz ripple is (erroneously) transmitted continuously, the relay is safeguarded against spuriously following a full cycle of operation in response thereto.

Referring again to FIG. 1, there are shown in FIG. 1*b* on an enlarged scale, parts of the 175 Hz signal of FIG. 1*a*, and in FIGS. 1*c* and 1*d* the possible extremes of timing of the consequent signals 20 and 21 generated by the timebase circuit 70. The variation in possible starting time of these timebase pulses arises from the fact that the oscillator 56 operates asynchronously relative to the 175 Hz signal superimposed on the mains power supply. Thus the very low frequency beat signal may start at any point on its waveform. Furthermore there is a tolerance of $\pm\frac{1}{2}$Hz on the ripple frequency, and the amplitude of the ripple signal will decrease as the distance between the modulator (generally in the power station) and the ripple-control relay increases. At one extreme, the beat signal may start just as it is about to exceed one of the thresholds, and the ripple signal is at maximum frequency and amplitude, giving rise to rapid traversal by the beat signal between the thresholds. In the other extreme, the beat signal may start just as it drops below a threshold magnitude, and the ripple signal is at minimum frequency and amplitude. In the first case (FIG. 1*c*) the time-base circuit 70 is triggered almost concurrently with the commencement of the starting pulse (so there is only the fixed 640-millisecond delay before the timebase pulse 20 starts), and the sequence gate 62 takes about 350 milliseconds to recognise each pulse, starting from its leading edge. In the second case (FIG. 1*d*) the timebase pulse 20 starts only after a further delay of about 400 milliseconds, and recognition takes 750 milliseconds. Consequently, the command window-pulses 22 must be of sufficient duration to ensure that the 175 Hz control-signal pulses, as represented intermediately by the 2—3 Hz beat notes and ultimately by the detection signals from the sequence gate 62, are properly detected at either extreme of timing of the timebase pulses 21, with which the command window-pulses 22 are synchronised. Similarly, the check window-pulses 23 have a duration chosen to ensure detection of spurious 175 Hz ripple between starting or control-signal time-slots, but to avoid inadvertent misidentification as such spurious signal of properly-present ripple constituting such starting or control signals.

Provided no spurious 175 Hz ripple is detected during the corresponding check window-pulse 23, a detection signal indicating detection of a control-signal pulse causes an enabling pulse 24 to be supplied by the window detector 72 on a line 97 at the end of that check window-pulse 23 (see control-signal pulse 2, for example, in FIGS. 1*c* and 1*d*. )

Referring again to FIG. 2, the timebase pulses 20, 21 on the line 92 and the enabling pulses 24 on the line 97 are supplied to the counter and comparator circuit 80 which counts the trailing edges of the pulses 20, 21 and compares the count with a three-digit binary number preset in a preselection store 82. This number identifies which of the first to seventh control-signal pulses must be transmitted to the relay before commands represented by following pulses can be implemented. As noted previously, however, this preselection can be overridden by presetting the store 82 with 000.

When the store 82 is preset with 000, a first stage 80*a* of the circuit 80 maintains open a gate 84 which receives the enabling pulses 24 on the line 97. For any other number preset in the store 82, the gate 84 is opened by the stage 80*a* only when the count in the circuit 80 equals the preset number, and if, simultaneously, an enabling pulse 24 is received from the window detector 72.

Enabling pulses 24 supplied to the gate 84 while it is open are passed via a line 98 to a second stage 80*b* of the counter and comparator circuit 80, which counts groups of five timebase pulses 20, 21 and compares the group count with two numbers X and Y preset in an instruction store 86. The number X identifies the group of time-slots to which the first of the relay units in the relay circuit 42 is responsive, and to which the second relay unit is optionally responsive; while the number Y identifies the group of time-slots to which the second relay unit is alternatively responsive.

When the group count in the circuit 80*b* equals the number X, the line 98 is coupled by the circuit 80*b* to two gates 88*a* and 88*b* so that any enabling pulses 24 occurring in the relevant group of four time-slots are supplied to the gates 88*a* and 88*b*. Similarly, the line 98 is coupled to two more gates 88*c* and 88*d* when the group count equals the number Y.

The gates 88*a* to 88*d* are opened by the circuit 80*b*, in response to the timebase pulses 20, 21, for the first to fourth time-slots respectively in each group of five time-slots. Thus an enabling pulse 24 occurring during the first time-slot in the group identified by X is supplied to the gates 88*a* and 88*b*, of which only the gate 88*a* is open.

An input A/B of the gates 88 controls connecting circuitry between the gates 88*a* and 88*c*, and between 88*b* and 88*d*, so that, in state A the outputs of the gates 88*c* and 88*d* in fact supply the same output signals as the gates 88*a* and 88*b* respectively, derived from the first and second time-slots in the group X. In state B, the gates 88*c* and 88*d* supply their own output signals, derived from the third and fourth time-slots in the group Y (though X and Y may be equal).

Signals on the outputs of the gates 88*a* and 88*c* operate to close the contacts of the first and second relay units respectively, while signals on the outputs of the gates 88*b* and 88*d* open them.

A signal to reset the sequence gate 62, the window detector 72 and the counter and comparator circuit 80 is supplied by the timebase circuit 70 on a line 96 when power is applied or re-applied to the relay; when the relay has counted forty control-signal time-slots after a starting pulse; or when the operation of the timebase circuit 70 is arrested prematurely as described earlier.

The various circuits shown generally in FIG. 2 will now be described in greater detail with reference to FIGS. 3 to 8, FIGS. 3A and 3B showing the waveforms at various points in the circuits of FIGS. 4 to 8.

Figure 4:
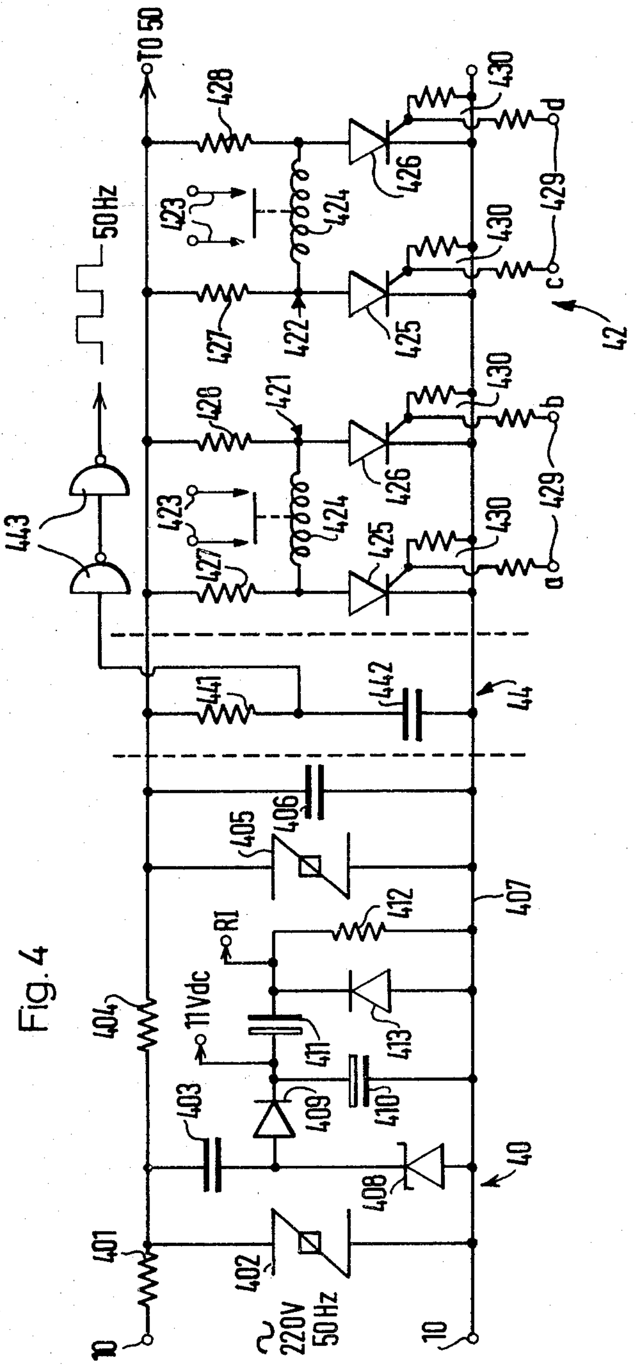

Referring to FIG. 4, the power supply and protection unit 40 includes a current-limiting resistor 401 and a varistor 402 connected in series between the input terminals 10. The varistor 402 limits the transient voltage across its terminals to about 530 volts. A capacitor 403 connected to the junction of the resistor 401 and the varistor 402 damps rapid increases in voltage. A second similar protection stage comprising a current-limiting resistor 404, a varistor 405 and a capacitor 406 is connected in series with the first stage, the transient voltage across the varistor 405 being limited to about 470 volts. The capacitor 406 in the second stage is connected directly across its associated varistor 405, with one terminal connected directly to a common line 407. However, the corresponding capacitor 403 in the first stage is coupled to the line 407 via a 12-volt zener diode 408. This zener diode 408 provides a 12-volt source for a half-wave rectifying circuit, comprising a rectifier 409 and a smoothing capacitor 410, which supplies current at 11-volts d.c. for the electronic components in the circuit. A differentiating circuit comprising a capacitor 411 and a resistor 412 in series is connected between the 11-volt supply and the common line 407. A diode 413 is connected in parallel with the resistor 412. Whenever the mains power is applied, or re-applied (eg. after a mains supply failure) the differentiating circuit produces a single, unipolar pulse RI to reset the timebase circuit 70 which in turn resets, via the line 96, the sequence gate 62, the window detector 72 and the circuit 80. The output from the second protection stage is taken from the terminals of the capacitor 406, and goes to the trigger circuit 44, the relay circuit 42 and the band-pass filter 50.

The trigger circuit 44 comprises a resistor 441 and a capacitor 442 in series between the output of the second protection stage and the common line 407. The relatively low, smoothed voltage at their junction is supplied to two Schmitt trigger circuits 443 in series which produce square-wave clock pulses at the frequency of the mains supply (nominally 50 Hz).

The relay circuit 42 includes two bistable relay units 421 and 422 having contacts 423 operated by coils 424. The two terminals of each coil 424 are connected to the anode electrodes of respective thyristors 425 and 426, the cathode electrodes of which are connected to the common line 407. The anode electrodes of the thyristors 425 and 426 in each relay unit 421 and 422 are coupled via respective resistors 427 and 428 to the output of the second protection stage. Four input terminals 429a to 429d are coupled by respective voltage dividers 430 to the gate electrodes of respective ones of the four thyristors 425 and 426.

When a pulse signal is applied to, for example the input terminal 429*a* of the relay unit 421, the associated thyristor 425 turns ON, and a corresponding pulse of half-wave rectified current flows through that thyristor 425 the coil 424 and the resistor 428 of the relay unit 421, thereby closing its contacts. The contacts are then maintained closed by a permanent-magnet latch. If the input terminal 429*b* is energised instead, a pulse of current flows in the opposite direction through the coil 424, via the thyristor 426 and the resistor 427, and the contacts 423 of the relay unit 421 open, being then kept open by the magnetic latch. The relay unit 422 operates in the same manner in response to signals applied to the input terminals 429*c* and 429*d*.

Figure 5:
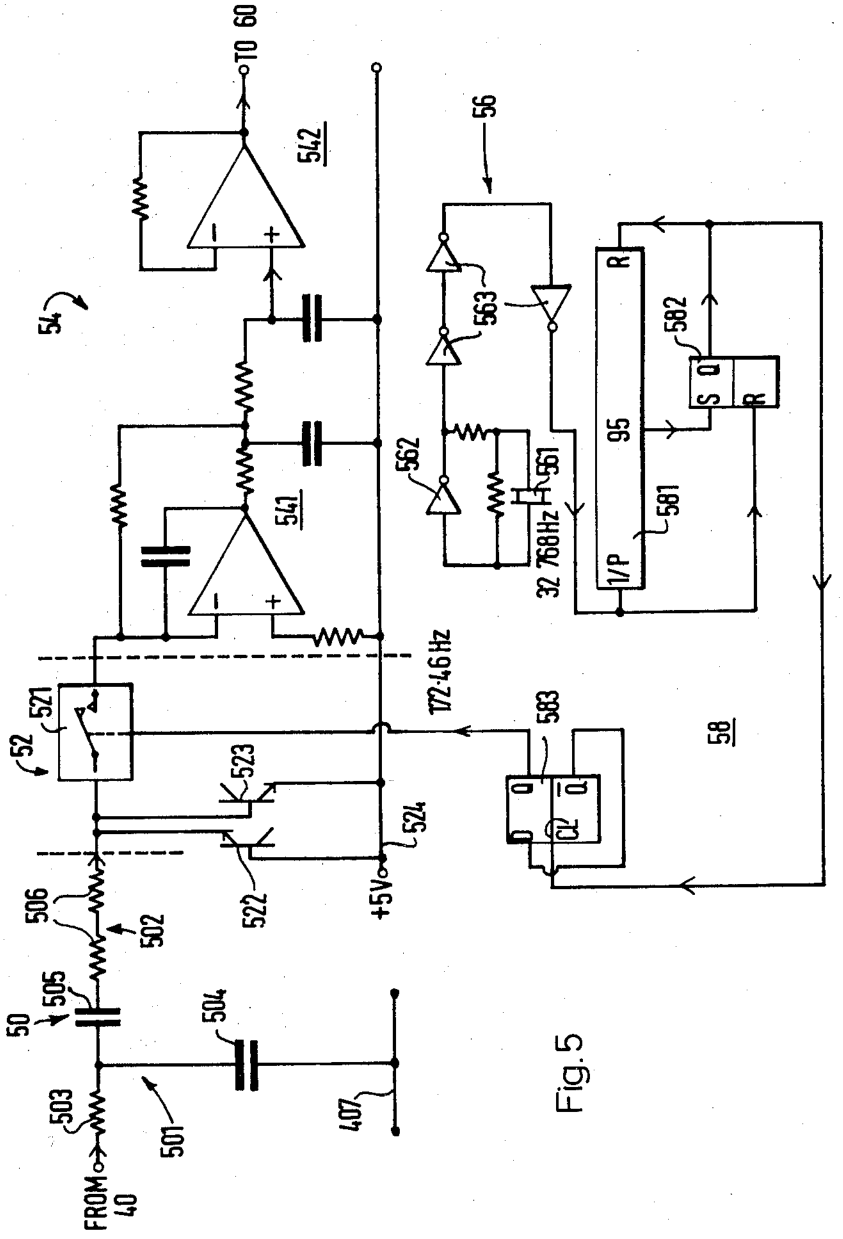

Referring now to FIG. 5, the band-pass filter 50 comprises a low-pass filter stage 501 and a high-pass filter stage 502 in series. The low-pass filter stage 501 has a resistor 503 in series with the input from the protection unit 40 and a capacitor 504 coupled between the resistor and the common line 407. The values of these two components are chosen to give a minus 3-dB point at 225 Hz. The high-pass filter stage 502 comprises a capacitor 505 in series with two resistors 506, the values being chosen for a minus 3-dB point at 250 Hz. This stage 502 attenuates by a factor of 3½ the 50 Hz signal relative to the 175 Hz signals.

The output from the high-pass filter stage 502 is supplied to the input of the chopper 52, which comprises an MOS switch device 521 and two diodes 522 and 523 connected in parallel and in opposite sense to one another between the input of the switch device 521 and a common line 524 which is at approximately +5 volts. These diodes 522 and 523, which take the form of the base-emitter junctions of two transistors, limit the voltage applied to the switch device 521 when it is in its open-circuit condition, and thereby prevent it being damaged by the mains supply voltage.

The capacitor 505 in the high-pass filter stage 502 provides d.c. isolation between the circuits connected to the common line 407 and those connected to the common line 524.

The switch device 521 operates in response to the pulses supplied by the oscillator 56 and divider 58. The oscillator 56 includes a quartz crystal 561 tuned to 32 768 Hz and connected in a feedback configuration to an amplifier 562. Additional buffer amplifiers 563 shape the oscillator waveform and apply it to the input of a counter circuit 581 in the divider 58. When the counter 581 has counted 95 pulses or cycles it provides an output signal to set a bistable circuit 582. This bistable circuit 582 then provides a signal to reset the counter 581 and switch a D-type bistable circuit 583. The bistable circuit 582 is itself reset by pulses from the oscillator 56. Thus the counter 581 operates as a divide-by-95 frequency divider.

The D-type bistable circuit 583 divides the signal by a further factor of two, to provide a total division ratio of 190, and thus a square-wave output signal having a pulse repetition frequency of 172.40 Hz and a mark-to-space ratio of 1:1. The switch device 521 switches in response to this output signal, which is thus mixed with the signal derived from the network voltage by the bandpass filter 50 via the protection unit 40. The mixing produces a number of sum and difference beat signals, including in particular the difference signal arising from the beating of the switching-frequency signal with the ripple signal (when this is present on the network).

The frequency of the switching signal (172.46 Hz) is chosen to be at a small but finite spacing from the ripple signal frequency, and, bearing in mind the tolerance of ±½ Hz on the 175 Hz ripple frequency, provides a difference beat frequency of between 2.04 and 3.04 Hz. The choice of switching frequency is also affected by the need to avoid signals of similar frequency to this wanted beat frequency but arising from the beating together of harmonics (such as the 11th and 13th of the 50 Hz mains frequency and harmonics (such as the 3rd and 5th) of the switching frequency. In assessing the risk of such beat frequencies it must be remembered that the mains frequency may vary between 48 and 51 Hz. The risk of such beat frequencies being produced is also minimised by the reduction in amplitude of the harmonics of 50 Hz effected by the low-pass filter stage 501.

The effect of the switch device 521 is to down-shift the control-signal pulses from 175 Hz to about 2½ Hz. A frequency of this order is high enough to permit reliable identification of a control signal one second in duration (as will be hereinafter described) but low enough in comparison with the strong 50 Hz mains signal and its harmonics to permit effective filtering. In this respect it may be noted that the frequency ratio between the mains supply (50 Hz) and the control signal (175 Hz) is only 3.5. The frequency shift effectively performed by the chopper 52 on the control signal, from 175 Hz down to 2½ Hz, increases this ratio to approximately 20 (minimum 16.5 when the beat frequency is 3.04 Hz).

The filtering to extract the desired 2½ Hz beat frequency is performed by a 3rd order active low-pass filter 541 of conventional design. The values of the capacitors and resistors are chosen to give a filter characteristic which has a minus 3-dB point at about 4½ Hz. Provided close-tolerance resistors are used, this filter 541 does not need adjustment, even to compensate for capacitor tolerances, and can be made either with discrete components or in integrated circuit form. In contrast, the narrow-bandwidth band-pass filter centred on 175 Hz and the root-of-sum-of-squares circuits used in the aforementioned known ripple-control relays are complicated and need careful adjustment.

The filtered 2–3 Hz signal from the output of the filter 541 is supplied to a buffer-amplifier 542 which provides impedance matching between the filter 541 and the dual comparator 60.

Figure 6:
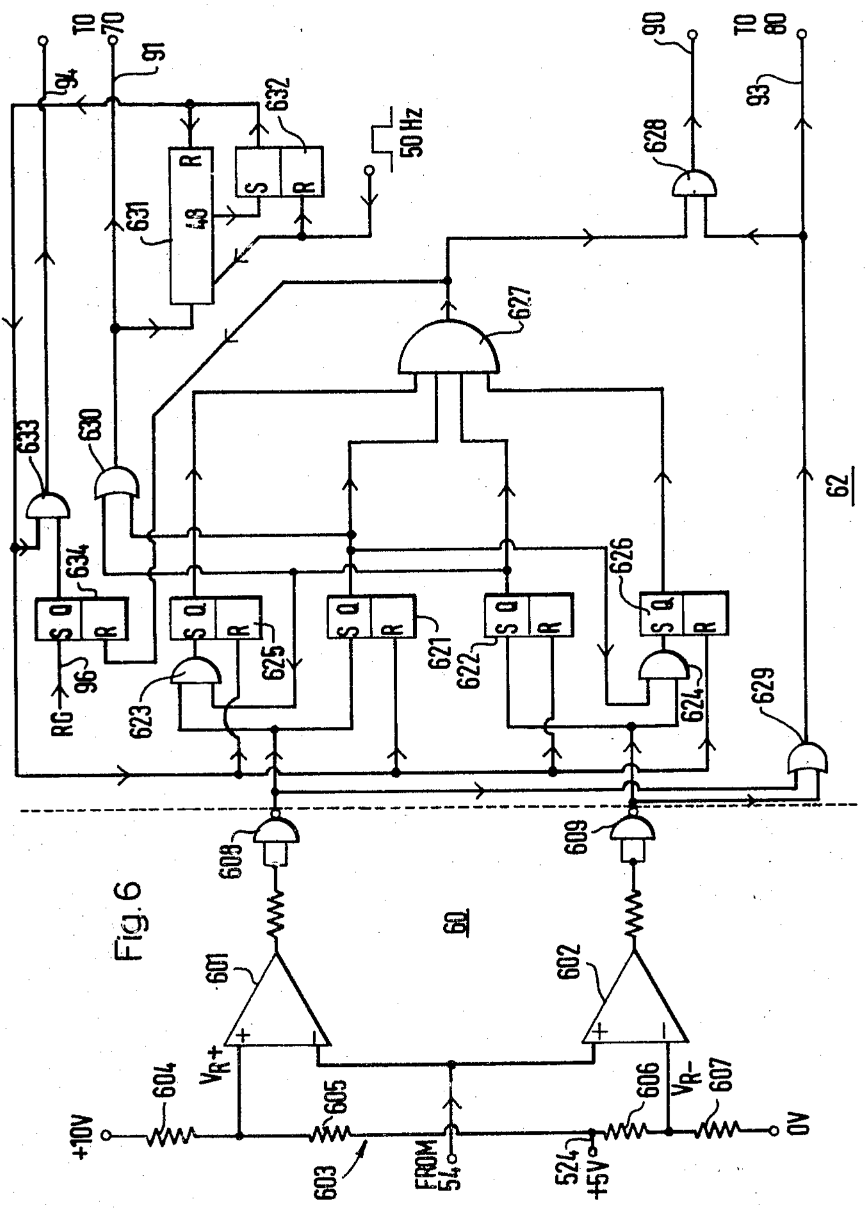

As shown in FIG. 6, the dual comparator 60 comprises two comparators 601 and 602 and a voltage divider network 603. The signal from the low-pass filter 54 (FIG. 3A*a*) is applied to the inverting input of the comparator 601 and to the non-inverting input of the comparator 602. The divider network 603 comprises four resistors 604 to 607 connected in series between a +10 volt stabilised supply derived from the 11-volt supply in the unit 40, and OV. The centre junction, between the resistors 605 and 606, defines the potential of the line 524. The more positive junction, between the resistor 604 and 605, is connected to the non-inverting input of the comparator 601, and the more negative junction, between the resistors 606 and 607, is connected to the inverting input of the comparator 602. Thus, when the magnitude of the 2–3 Hz beat frequency signal from the low-pass filter 54 is more positive than the positive reference voltage $V_R+$ (relative to the common line 524), the comparator 601 provides a zero output signal. When the magnitude is more negative than the negative reference voltage $V_R-$ (relative to the common line 524), the comparator 602 provides a zero output signal. In practice, the resistors 604 and 607 are equal, but the resistors 605 and 606 are unequal. Thus the voltage of the line 524 is not centrally placed between the reference voltages. This assymmetry is required to compensate for a small continuous offset voltage which appears at the output of the low-pass filter 54 and arises from the effect of the voltage limiting diodes 522 and 523 and the inequality of sensitivity of the inverting and non-inverting inputs of the amplifier in the filter 541.

The zero-voltage output signals of the comparators 601 and 602 are converted to logic signals (at logic level 1) by respective inverters 608 and 609, and supplied to the sequence gate 62.

In the sequence gate 62, the signals from the inverters 608 and 609 are applied directly to the SET inputs of respective bistable circuits 621 and 622. They are also applied via AND-gates 623 and 624 to the SET inputs of two more bistable circuits 625 and 626. The two AND-gates 623 and 624 also receive the signals from the Q outputs of the bistable circuits 622 and 621 respectively. Consider the situation in which the instantaneous magnitude of the 2–3 Hz beat frequency signal crosses the positive, negative and then again the positive threshold values $V_R+$ and $V_R-$ (see the START signal in FIG. 3A). When the first crossing occurs, the comparator 601 and the inverter 608 provide a logic 1 signal (FIG. 3A*b*) to the bistable circuit 621 and the AND-gate 623. The bistable circuit 621 will be SET (FIG. 3A*d*) but the AND-gate cannot SET the bistable circuit 625 because it is blocked by the logic 0 signal from the Q output of the bistable circuit 622.

Figure 3A:
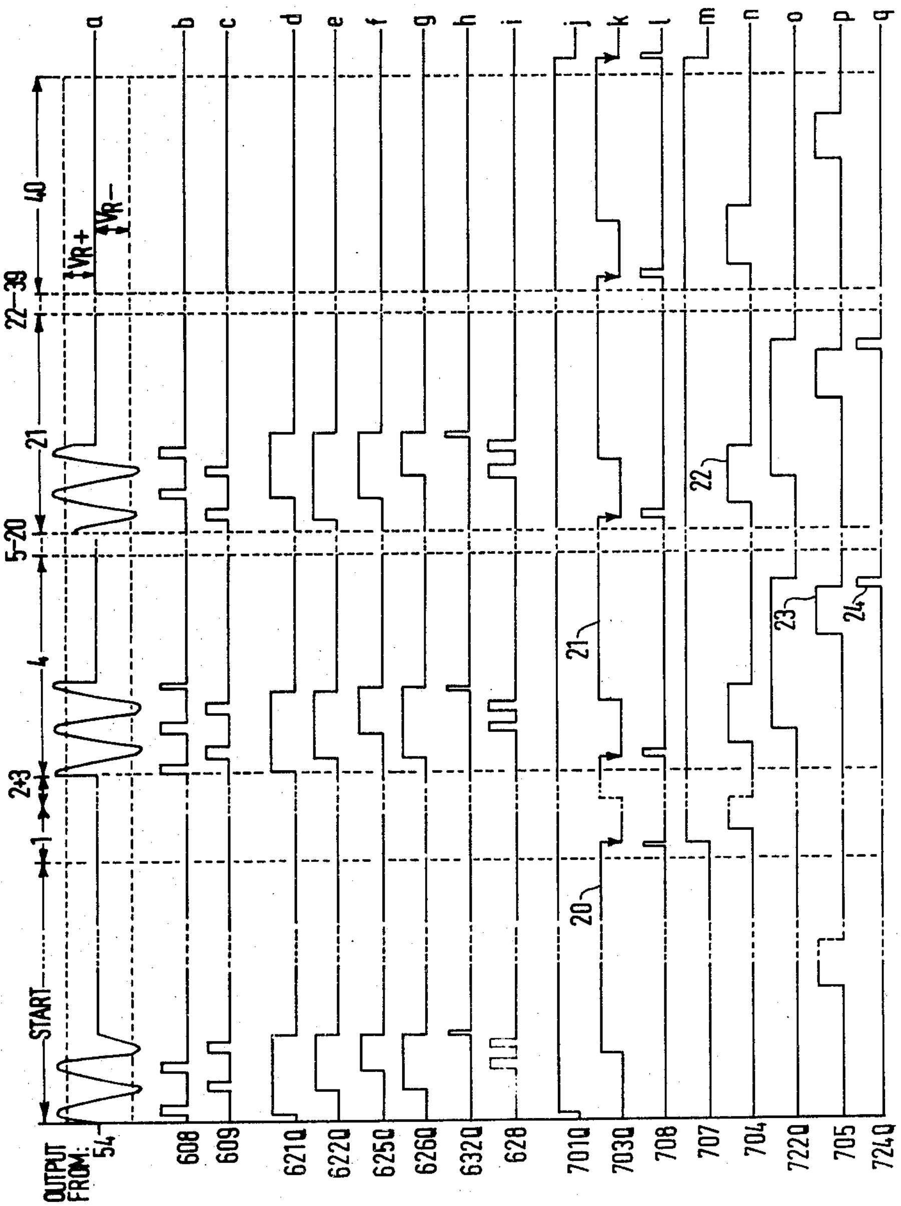

When the second crossing takes place, the comparator 602 and the inverter 609 (FIG. 3A*c*) supply a logic 1 signal which SETS the bistable circuit 622 (FIG. 3A*e*) and also, because the AND-gate 624 is receiving a logic 1 signal from the bistable circuit 621, SETS the bistable circuit 626 (FIG. 3A*g*). It will be noted that the AND-gate 623 now also receives a logic 1 signal, from the bistable circuit 622.

Thus, upon the third crossing, the resulting new logic 1 signal supplied by the comparator 601 and the inverter 608 SETS the bistable circuit 625 (FIG. 3A*f*) via the AND-gate 623.

An AND-gate 627 receives the Q output signals of the four bistable circuits 621, 622, 625 and 626, and thus, when all four of these circuits are SET, provides an output signal to one input of an AND-gate 628. The other input of the AND-gate 628 receives, via an OR-gate 629, either of the signals from the inverters 608 and 609. Therefore the logic 1 signal supplied by the inverter 608 upon the third crossing opens the AND-gate 628 (FIG. 3A*i*) and supplies the detection signal to the window detector 72 on the line 90. The OR-gate 629 also supplies the signal from either of the inverters 608 and 609 directly to the window detector 72 on the line 93.

If the magnitude of the beat frequency signal crosses the threshold values in the sequence negative, positive, negative, the operation of the sequence gate is similar to that described above, but the bistable circuits switch in the sequence 622: 621 and 623: 624 (see pulse 21 in FIG. 3A).

The Q outputs of the two bistable circuits 621 and 622 are also coupled via an OR-gate 630 to an enable input of a counter 631, and to the timebase circuit 70. The counter 631 counts the 50 Hz clock pulses when enabled (that is, when either of the bistable circuits 621 and 622 is SET), and, after 48 pulses (960 milliseconds) supplies an output signal to SET a bistable circuit 632. This circuit 632 then supplies a signal from its Q output (FIG. 3A*h*) to the reset inputs of the counter 631 and the bistable circuits 621, 622, 625 and 626. Thus, there is a time limit within which these four bistable circuits must be SET if a detection signal is to be produced by the AND-gate 627. If only one or three of these bistable circuits are SET at the end of the 960-millisecond time limit, they are RESET again without a detection signal being produced. A short spurious signal on the mains supply network, or a transient which reached the filter 54, would not produce the three crossings of the reference voltages in the correct sequence required to SET all four bistable circuits 621, 622, 625 and 626, so only authentic 175 Hz ripple voltage will cause a detection signal to be produced.

The reset signal produced by the bistable circuit 632 is also supplied to an AND-gate 633 which receives a second input from the Q output of a bistable circuit 634. Normally this bistable circuit 634 is RESET by the output signal from the AND-gate 627, and the AND-gate 633 therefore produces no signal. However, if a reset signal is produced by the bistable circuit 632 without there being a signal at the output of the AND-gate 627 (for example, if a spurious signal has caused only partial operation of the sequence gate 62), then the bistable circuit 634 remains SET. In this case the AND-gate 633 supplies a signal to the timebase circuit 70, on the line 94, and, if the relay has not already received a proper starting pulse, this signal will then arrest the operation of the relay, as described earlier.

Figure 7:
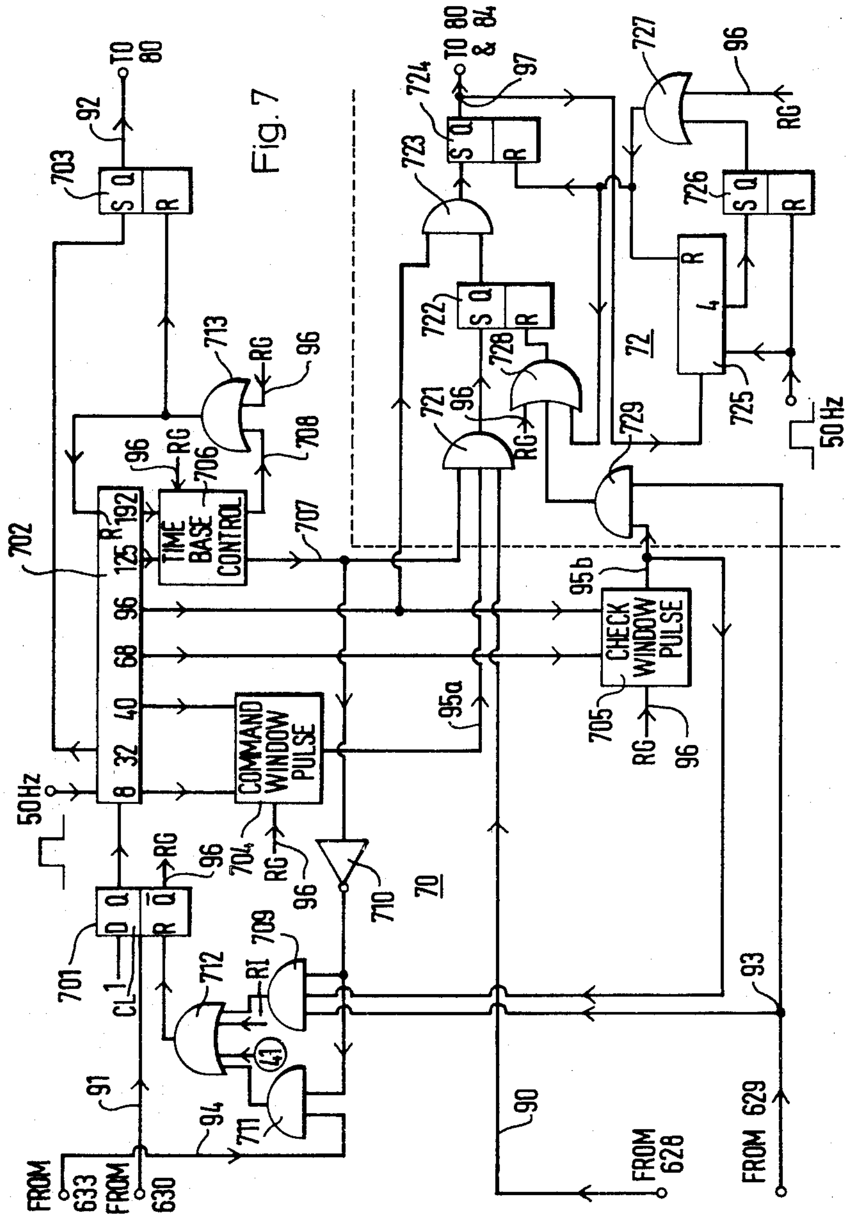

Referring now to FIG. 7, the output of the OR-gate 630 in the sequence gate 62 is coupled via the line 91, to the clock input of a D-type bistable circuit 701. The Q output of this bistable cirucit 701 is coupled to the enable input of a counter 702 which also receives the 50 Hz clock pulses. The counter 72 provides outputs for a variety of counts: at 32 to the SET input of a bistable circuit 703; at 8 and 40 to the inputs of a command window-pulse generator 704; at 68 and 96 to the inputs of a check window-pulse generator 705; and at 125 and 192 to the inputs of a timebase control circuit 706.

Thus, when the circuit is quiescent and a signal is received from the OR-gate 630 (indicating that one of the bistable circuits 621 and 622 is SET, and, therefore, that the detection of a pulse of 175 Hz ripple signal has begun) the D-type bistable 701 is SET (FIG. 3A*j*), and causes the counter 702 to commence counting 50 Hz clock pulses.

After 32 pulses (640 milliseconds) the counter 702 SETS the bistable circuit 703, which then supplies a timebase pulse 20 on the line 92 (FIG. 3A*k*). If the pulse of 175 Hz ripple signal is a starting pulse (that is, the first pulse to be received since the timebase control circuit 706 was last reset by a signal on the line 96), the timebase control circuit 706 does not produce any output signal until 192 clock pulses have been counted (that is, after 3840 milliseconds). At this time, the circuit 706 energizes an output 707 to provide a continuous logic 1 signal thereat (FIG. 3A*m*), and provides a short reset signal at an output 708 (FIG. 3A*l*). This reset signal is supplied to the bistable circuit 703 to terminate the timebase pulse 20, and to the counter 702, which then commences counting from zero again, triggering a timebase pulse 21 after another 32 clock pulses (FIG. 3A*k*). Thereafter, the timebase control circuit 706 provides similar reset signals on its output 708 every 125 clock pulses (that is, every 2500 milliseconds), to terminate the timebase pulses 21.

During each counting cycle of the counter 702, the command window-pulse generator 704 provides a 640-millisecond command window-pulse 22 on the line 95*a* (FIG. 3A*n*), commencing after 8 clock pulses (that is 160 milliseconds), and ending after 40 clock pulses (that is, 800 milliseconds). Similarly, the check window-pulse generator 705 provides a 560-millisecond check window-pulse 23 on the line 95*b* (FIG. 3A*p*), commencing after 68 clock pulses (that is, after 1360 milliseconds) and ending after 96 clock pulses (1920 milliseconds). The generators 704 and 705 and the circuit 706 may be readily constructed by one skilled in the art, for example using bistable circuits and AND-gates, and their detailed structure is therefore not shown, for the sake of clarity.

The window detector 72 includes an AND-gate 721 which receives the pulses from the output 707 of the timebase control circuit 706 and on the line 95*a* from the command window-pulse generator 704, and the detection pulses on the line 90 from the AND-gate 628 of the sequence gate 62. During the first, 3200-millisecond timebase pulse 20, triggered by a starting pulse, there is no signal on the output 707, and the AND-gate 721 cannot provide any output signal. However, thereafter the AND-gate 721 passes any detection signal from the AND-gate 628 which occurs at the appropriate time, that is, during a command window-pulse 22. The output of the AND-gate 721 is connected to the SET input of a bistable circuit 722, the Q output of which is coupled to an AND-gate 723. This AND-gate 723 also receives a signal from the counter 702 after it has counted 96 clock pulses (that is, at the end of each check window-pulse 23), and is in turn coupled to the SET input of a bistable circuit 724 which generates the enabling pulse 24 to be supplied via the line 97 to the counter and comparator 80.

A detection signal (FIG. 3A*i*) passed by the AND-gate 721 sets the bistable circuit 722 (FIG. 3A*o*), and, provided this circuit 722 is not reset beforehand in a manner that will be described, it causes the AND-gate 723 to set the bistable circuit 724 when the AND-gate 723 receives a signal after 96 clock pulses have been counted by the counter 702.

The Q output of the bistable circuit 724 is connected to a counter 725 which counts four 50 Hz clock pulses and then resets the bistable circuits 722 and 724 and itself by means of a signal supplied via a bistable circuit 726 and an OR-gate 727. Thus the bistable circuit 724 is SET for 80 milliseconds, thereby generating an enabling pulse 24 (FIG. 3A*q*).

The signal resetting the bistable circuit 722 is supplied to its RESET input via an OR-gate 728. This OR-gate 728 receives another input from an AND-gate 729 which is responsive to the check window-pulse generator 705 via the line 95*b*, and to the OR-gate 629, via the line 93, in the sequence gate 62 (FIG. 6). The AND-gate 729 provides an output signal only in the event that the OR-gate 629 is providing a signal during the period of a check window-pulse 23. A signal from the OR-gate 629 indicates that one or other of the comparators 601 and 602 is detecting a 2–3 Hz beat frequency signal: that is, that 175 Hz ripple is present on the mains supply network. The check window-pulses 23 are generated in the periods when there should be no 175 Hz ripple, that is in the intervals between control-signal time-slots. Thus an output signal from the AND-gate 729 corresponds to the erroneous presence of 175 Hz ripple, and to the existence of a fault. This signal is therefore supplied to the OR-gate 728 to reset the bistable circuit 722 before the AND-gate 723 is opened at the end of the check window-pulse period, so the generation of an enabling pulse 24 is inhibited.

The check window-pulses 23 and the output signals from the OR-gate 629 are similarly correlated by an AND-gate 709 in the timebase circuit 70, but this gate 709 can only provide an output signal when it is enabled by an inverter 710 responsive to the signal on the output 707 of the timebase control circuit 706. It will be recalled that the signal on this output 707 is at logic 0 (so the inverter output signal is at logic 1) only until the end of the first timebase pulse 20, produced in response to a starting pulse (see FIG. 3A*m*). Thereafter the signal is at logic 1. Thus the AND-gate 709 is only enabled during this first timebase pulse 20. The inverter 710 also supplies its output signal to another AND-gate 711, which receives a second signal on the line 94 from the AND-gate 633 in the sequence gate 62 shown in FIG. 6. It will be recalled that this AND-gate 633 provides a signal if only some, but not all, of the four bistable circuits 621, 622, 625 and 626 have been set at the end of a 960-millisecond pulse detection period, indicating a spurious signal of some kind on the mains supply network.

Both of the AND-gates 709 and 711 supply their output signals via an OR-gate 712 to the RESET input of the bistable circuit 701. Thus, if, before the end of the timebase pulse 20 corresponding to a starting pulse, either the sequence gate 62 does not complete detection of the 175 Hz pulse, or a 175 Hz signal is detected in the interval following that pulse, then the bistable circuit 701 is immediately reset and the further detection and decoding of pulses is prevented, as mentioned earlier.

The OR-gate 712 also receives input signals from the power supply unit 40 (that is, the signal RI—see FIG. 4) and from the counter and comparator circuit 80 when forty-one timebase pulses 20, 21 have been counted. The signal RI is generated whenever the mains supply is applied or re-applied as mentioned earlier, and ensures initial resetting of the complete circuit; for example, after a power failure. The counting of the forty-first timebase signal indicates that the control-signal pulse train has finished, whereupon the relay must be reset to await another pulse train.

Figure 8:
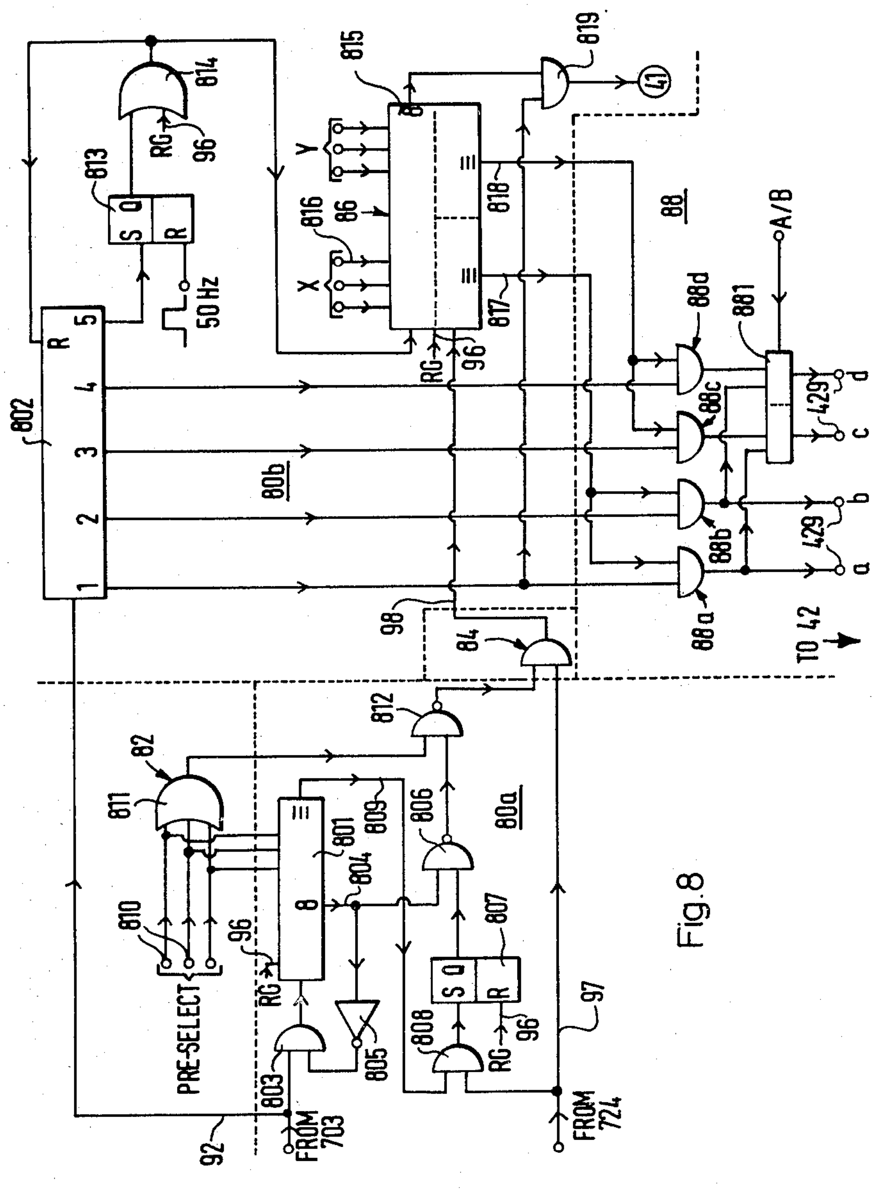

When the bistable circuit 701 is reset, it produces a signal RC on the line 96 which is supplied to the bistable circuit 634, the counter 702 and the bistable circuit 703 (via an OR-gate 713), the generators 704 and 705, the circuit 706, the OR-gates 727 and 728, and to the counter and comparator circuit 80 (FIG. 8). Thus, the resetting of the bistable circuit 701, for whatever reason, ensures that the relay is fully reset to await the occurrence of a train of pulses of 175 Hz ripple.

Figure 3B:
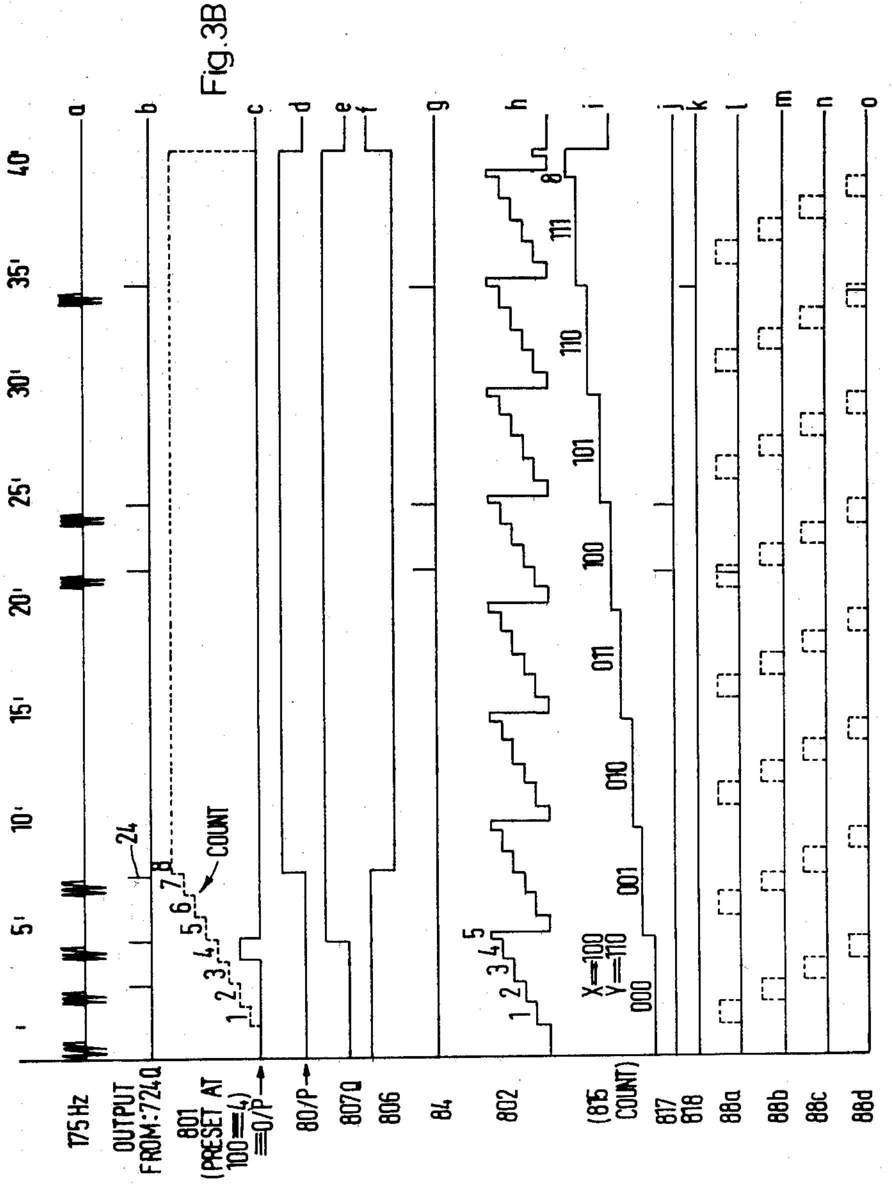

The implementation of control signals is effected by the circuitry shown in FIG. 8, the waveforms of which are shown in FIG. 3B.

Referring to FIG. 8, the timebase pulses 20, 21 from the bistable circuit 703 are supplied on the line 92, to counters 801 and 802 in the first and second stages 80*a* and 80*b* of the counter and comparator circuit 80. These counters 801 and 802 are responsive to the trailing edges of the pulses 20, 21.

The counter 801 receives the timebase pulses 20, 21 via an AND-gate 803, and, when it has counted the first eight pulses 20, 21 in any one pulse train, it supplies a signal (FIG. 3B*d*) on a first output 804 to an inverter 805 and a NAND-gate 806. The inverter 805 is coupled to the AND-gate 803, and upon receipt of the signal on the output 804 it closes this AND-gate 803 thereby preventing any further counting of timebase pulses 20, 21 by the counter 801. The NAND-gate 806 produces a logic 0 output (FIG. 3B*f*) only if it receives both the signal from the output 804 and a signal (FIG. 3B*e*) from the Q output of a bistable circuit 807.

The bistable circuit 807 may be set by a signal from an AND-gate 808 which is in turn responsive to the enabling pulses 24 (FIG. 3B*b*) supplied on the line 97 by the bistable circuit 724 and to a signal (FIG. 3B*c*) from a second output 809 of the counter 801. The counter 801 provides a signal on this output 809 if and when the number of timebase pulses 20, 21 it has counted equals a 3-digit number preset in binary form on three input terminals 810. This number is also supplied to an OR-gate 811 which forms the preselection circuit 82 (FIG. 2) and is in turn connected to one input of a NAND-gate 812 which supplies the output signal of the stage 80*a*.

If the binary number preset on the input terminals is 000, the OR-gate 811 provides a logic 0 signal, so the NAND-gate 812 generates a continuous logic 1 signal However, if any other number up to binary 111 is preset, the OR-gate 811 provides a logic 1 signal, and the NAND-gate 812 can then provide a logic 1 output signal only upon receipt of a logic 0 signal from the NAND-gate 806. Such a signal (FIG. 3B*f*), is generated at the time of the eighth timebase pulse (when a signal is generated by the output 804 of the counter 801—see FIG. 3B*d*) if previously, at the time of, coincidence of the binary number preset on the terminals 810 with the count in the counter 801, resulting in a pulse at the output 809 (FIG. 3B*c*), there has simultaneously been an enabling pulse 24 (representing a 175 Hz control-signal pulse) from the bistable circuit 724 (FIG. 3B*b*). Only in these circumstances will the AND-gate 808 be able to set the bistable circuit 807 (FIG. 3B*e*), thereby causing the NAND-gates 806 and 812 to generate logic 0 and logic 1 signals respectively.

A logic 1 signal generated by the NAND-gate 812 (either because preselection has been inhibited by setting 000 on the terminals 810, or because a control-signal pulse has been transmitted on the electricity distribution network in the appropriate time-slot corresponding to the number from 001 to 111 set on these terminals) is supplied to the gate 84, comprising an AND-gate, which thereupon opens to pass enabling pulses 24 (FIG. 3B*g*) from the bistable circuit 724 to the line 98.

The timebase pulses 20, 21 supplied to the counter 802 are counted thereby and cause 8 cycles of successive energisation of five output terminals. Each terminal is energized for a period of 2500 milliseconds in each cycle, and the energization of the first terminal in the first cycle begins at the end of the timebase pulse 20 corresponding to the starting pulse on the mains supply (FIG. 3B*h*). The first four output terminals are connected to respective ones of the gates **88*a* to 88*d*. The fifth output terminal is connected to a bistable circuit 813 which supplies a signal via an OR-gate 814 to reset the counter 802 and also to step forward by one the count in another counter 815**.

The counter 815 effectively counts the successive groups of four usable time-slots (FIG. 3B*i*). The counter 815 contains the instruction circuit 86, and receives the two binary numbers X and Y preset on input terminals 816. It also receives via the line 98 any enabling pulses 24 passed by the gate 84. When the count of groups of time-slots corresponds to the number X or the number Y, the counter 815 supplies any enabling pulses 24 it receives during that count to a respective one of two outputs 817 (FIG. 3B*j*) and 818 (FIG. 3B*k*).

When the counter 815 has counted eight groups, it supplies a signal to an AND-gate 819, which then responds to the next energization of the first output of the counter 802 to generate a signal indicating the forty-first timebase pulse, thereby to reset the bistable circuit 701 in the timebase circuit 70 as described earlier.

Any enabling pulse 24 on the output 817 of the counter 815 is supplied to both gates **88*a* and 88*b*. Similarly, enabling pulses 24 appearing on the output 818 are supplied to the gates 88*c* and 88*d*. Each enabling pulse 24 is passed by one or other of the gates 88 to which it is supplied, in accordance with the position of the corresponding control-signal pulse in the pulse train, under the control of the counter 802 which opens the gates 88** in sequence (FIGS. 3B*l* to 3B*o*). Thus, for example, an enabling signal 24 resulting from a control-signal pulse occupying the first time-slot in a group will be supplied to both the gates **88*a* and 88*b*. However, the sequential energization of the gates 88 will result in only the gate 88*a* being opened concurrently with the supply of this enabling pulse 24, which thus appears only at the output of this gate 88*a*** (FIG. 3B*l*).

The outputs of the gates **88*a* and 88*b* are coupled directly to the terminals 429*a* and 429*b* of the relay unit 421 (FIG. 4). However, the terminals 429*c* and 429*d* of the relay unit 422 may be selectively coupled by a switch circuit 881 to the outputs of either the gates 88*a* and 88*b* or the gates 88*c* and 88*d*. Thus the relay units 421 and 422 can be operated together or independently, in accordance with the signal A/B preset into the switch circuit 881**.

Therefore, every time a pulse train is received, the gates 88 are opened. If a preselection code other than 000 has been set on the terminals 810, and an appropriately-positioned control-signal pulse is sent, the gate 84 opens to allow the resulting enabling pulses 24 through. The gate 84 also opens if a 000 code is applied to the terminals 810. In either case, the enabling pulses 24 are then supplied to the counter 815 which only passes those pulses 24 (if any) which occur during the group of time-slots identified by the code X for the relay unit 421 (and possibly also for the relay unit 422), and by the code Y (if the relay unit 422 is instead being operated independently). Any such pulses 24 are then supplied to the gates 88 which route them to the appropriate terminal 429 to effect the desired operation of the relay units 421 and 422.

Most of the circuit shown in FIG. 2 can be advantageously implemented in LSI integrated-circuit form, with the exception, that is, of large-value capacitors, the relay units 421 and 422, the quartz crystal 561 and the rectifiers and varistors in the power supply and protection circuit 40.

The relay described above is particularly suitable for use in circumstances in which a very high standard of reliability and accuracy is required, such as the remote-control of off-peak and peak charge rates in electricity meters. In other circumstances, such as load management (for example, the remote switching of street lights to regulate the load on a power station), the circuit may be altered and simplified. Thus, the criterion for recognition of the 2–3 Hz beat frequency could be reduced to crossing once only of the reference voltages, or even to two consecutive crossings of only a single reference voltage. Alternatively, other forms of detector circuit may be used.

The shifting of the frequency of the ripple signals before detection may be performed in other ways than by chopping. For example, a conventional multiplier circuit may be used to multiply the incoming 175 Hz signal by a sine-waveform signal at a frequency of 172.46 Hz.

The ripple voltage and switching frequencies may be varied to suit individual circumstances, provided the resultant beat frequency is suitably low and spurious beat frequencies between harmonics of the mains supply and the switching frequencies are avoided. For example, a ripple frequency of 290 Hz may be used with a switching frequency of 292.57 Hz (obtained by dividing 32 768 Hz by 112), to give a nominal beat frequency of 2.57 Hz.

Figure 9:
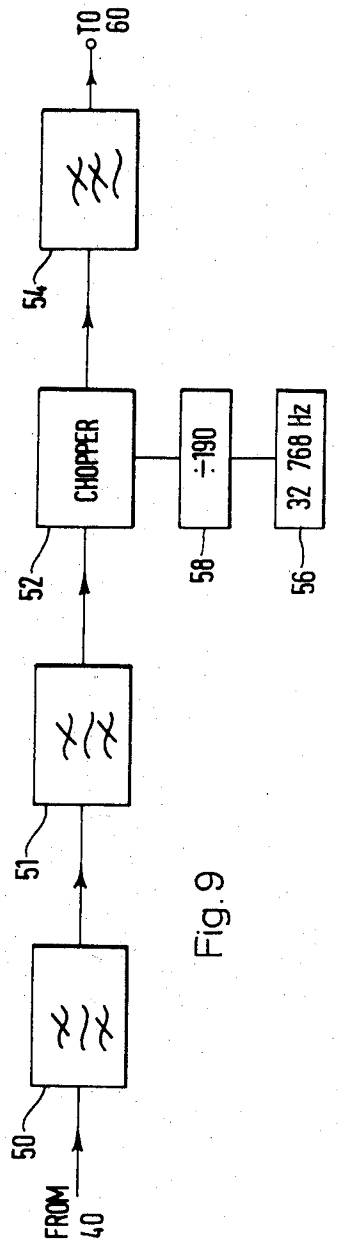
Figure 10:
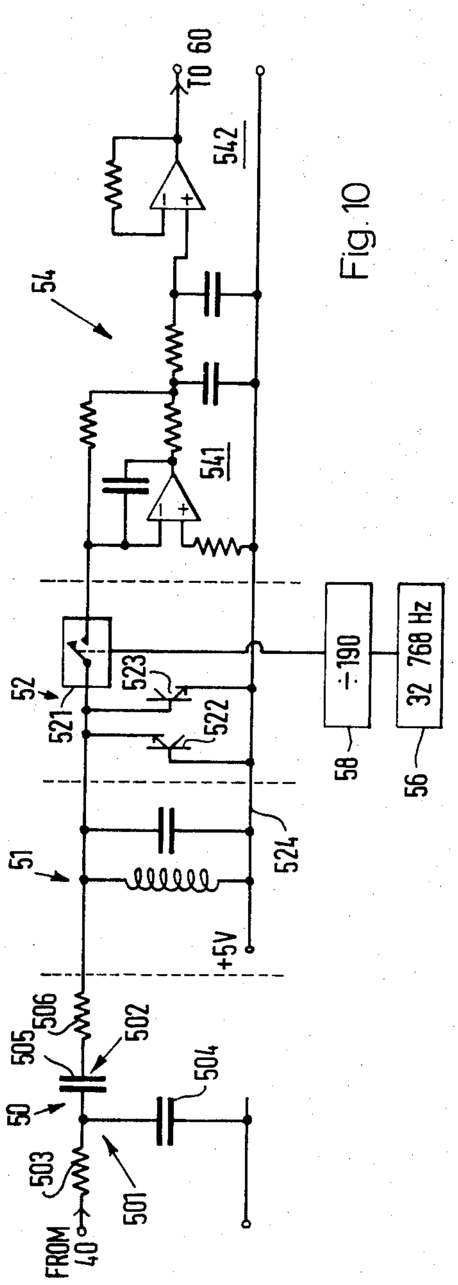

Under certain circumstances, it may be advantageous to augment the bandpass filtering provided by the filter 50 (FIG. 2). For example, as shown in FIG. 9, an extra bandpass filter 51, having a narrower passband than the filter 50, may be interposed between the filter 50 and the chopper 52. This filter 51 could be a conventional parallel LC passive turned filter, as shown in FIG. 10, with a a passband of 15 Hz centred on 175 Hz, or perhaps a triple stage active RC filter again of conventional design.

Figure 11:
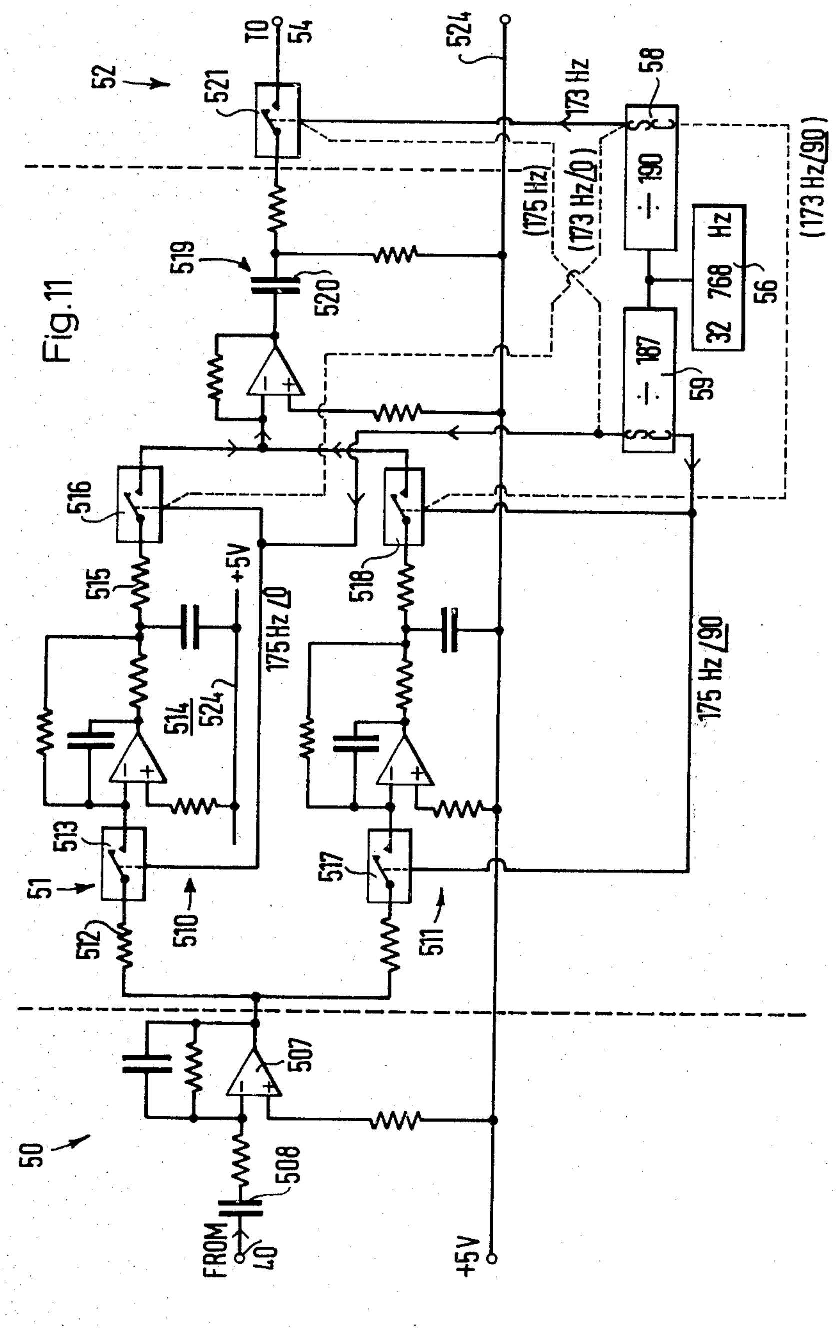

Alternatively, a filter incorporating the principle of correlation can be used for the bandpass filter 51, as shown in FIG. 11.

FIG. 11 also shows a second form of the bandpass filter 50 which can conveniently be used with a correlation filter. This filter 50 includes an amplifier 507 in an RC active filter network of conventional design, the values of the resistors and capacitors in the network being chosen to give the desired combination of a high-pass filter characteristic with a minus 3 dB point at 250 Hz and a low-pass filter characteristic with a minus 3 dB point at 225 Hz. An input capacitor 508 in this network provides d.c. isolation between the circuits 40 and 50 in the same manner as the capacitor 505 in FIG. 5.

The signal from the first bandpass filter 50 (with a relatively broad passband) is supplied to each of two parallel signal paths 510 and 511 in the second (narrower passband) bandpass filter 51. The two signal paths are the same in design and operation so only the path 510 will be described in detail.

An input resistor 512 in the path 510 is connected to an MOS switch device 513 (similar to the device 521 in FIG. 5), which is in turn coupled to a low-pass filter 514. This filter 514 is a 2nd order active type of conventional design, having a passband extending up to about $2\frac{1}{2}$ Hz.

The output of the filter 514 is supplied via a coupling resistor 515 to a second MOS switch device 516.

The signal path 511 includes two more MOS switch devices 517 and 518, corresponding to the devices 513 and 516 respectively in the first path 510. The outputs of the switch devices 516 and 518 in the two paths are summed by a buffer amplifier 519, which includes a capacitor 520, and supplied to the switch device 521 in the chopper 52.

The 32 768 Hz output of the oscillator 56 is divided by 190 in the divider 58 to generate a square-wave signal at a frequency of 172.46 Hz to operate the switch device 521, as in the circuit of FIG. 5. In addition, another divider 59 is provided to divide the 32 768 Hz signal by 187, giving an output at 175.23 Hz. Furthermore, the divider 59 includes circuitry of known type to generate two square wave output signals, one of which, C, is in quadrature phase with the other, S. The S signal operates the switch devices 513 and 516 in the path 510, and the C signal operates the switch devices 517 and 518 in the path 511.

In operation, the switch devices 513 and 517 in effect multiply the signal from the bandpass filter 50 by the 175 Hz correlation signals from the divider 59. The products of the multiplication by the switch device 513 (alternating signals at various frequencies superimposed on a d.c. signal) are supplied to the low-pass filter 514, which performs the equivalent of the mathematical operation of integration on these products to extract the d.c. signal. This d.c. output of the filter 514 has its peak magnitude relative to its zero-input value if the signal from the bandpass filter 50 includes a component at or close to the frequency of, and in phase or in anti-phase with, the S signal from the divider 59. In the case of a component in quadrature phase with the S signal, the filter 514 would produce no output signal corresponding to that component. However, such a component is in phase or in anti-phase with the C signal from the divider 59, and will therefore result in a signal being produced at the output of the low-pass filter in the path 511. For a component at approximately 175 Hz which is not in phase or in anti-phase with either of the S and C signals, both low-pass filters in the paths 510 and 511 produce output signals, which represent orthogonal constituents of a resultant output signal corresponding to the 175 Hz component.

In order to facilitate detection of these output signals, they are used to modulate the S and C signals, in the paths 510 and 511 respectively, by multiplication by the switch devices 516 and 518. The modulated 175 Hz S and C signals are summed by the buffer amplifier 519, and supplied to the chopper 52 and the low-pass filter 54 for beat frequency detection as previously described. The capacitor 520 provides isolation to block unwanted d.c. signals that are introduced by the operation of the switch devices 513, 516, 517 and 518.

Thus, the presence of 175 Hz ripple voltage on the mains supply network results in the production by the switch devices 516 and 518 of secondary 175 Hz signals, the amplitudes of which are dependent on the phase relationships between the 175 Hz ripple voltage and the S and C signals from the divider 59. These secondary 175 Hz signals can then be detected by the circuits 52, 54 and 60. On the other hand, when there is no 175 Hz ripple on the mains supply voltage, the low-pass filters (such as 514) in the signal paths 510 and 511 produce no significant (d.c.) output signal, so there is no secondary 175 Hz signal from either of the switch devices 516 and 518 to be detected by the following circuitry.

As described above, the filter 51, in which the input signal is correlated with the 175 Hz S and C signals, provides some supplementary filtering before the main filtering and detection which is effected by the circuits 52, 54 and 60. However, FIG. 11 can equally be considered as a correlation filter (the switch devices 513 and 517 together with the low-pass filter 514 and its counterpart in the signal path 511), with summation and detection of the phasor-components from the two low-pass filters being effected by the switch devices 516 and 518, the buffer amplifier 519, and the chopper 52, the low-pass filter 54 and the detector 60. In other words, this circuitry 516, 518, 519, 52, 54 and 60 provides a convenient alternative to the complex root-of-sum-of-squares circuits which have previously been used to combine and detect the phasor components represented by the d.c. output signals from a correlation filter (such as that constituted by the switch devices 513, 517 and their associated low-pass filters).

The generation of the $2\frac{1}{2}$ Hz beat frequency for detection by the circuits 54 and 60 merely requires that the frequency of operation of the chopper 52 should differ by the required beat frequency from the frequency of the signal supplied via the buffer amplifier 519. Thus, instead of supplying the switch devices 516, 518 with a 175 Hz signal and the switch device 521 with a 173 Hz signal, the devices 516, 518 could be operated (in phase quadrature) at 173 Hz (as indicated by dashed lines in FIG. 11) and the device 521 could be operated at 175 Hz. In either case, the switch devices 513 and 517 must be operated by quadrature-phase signals at 175 Hz.

Figure 12:
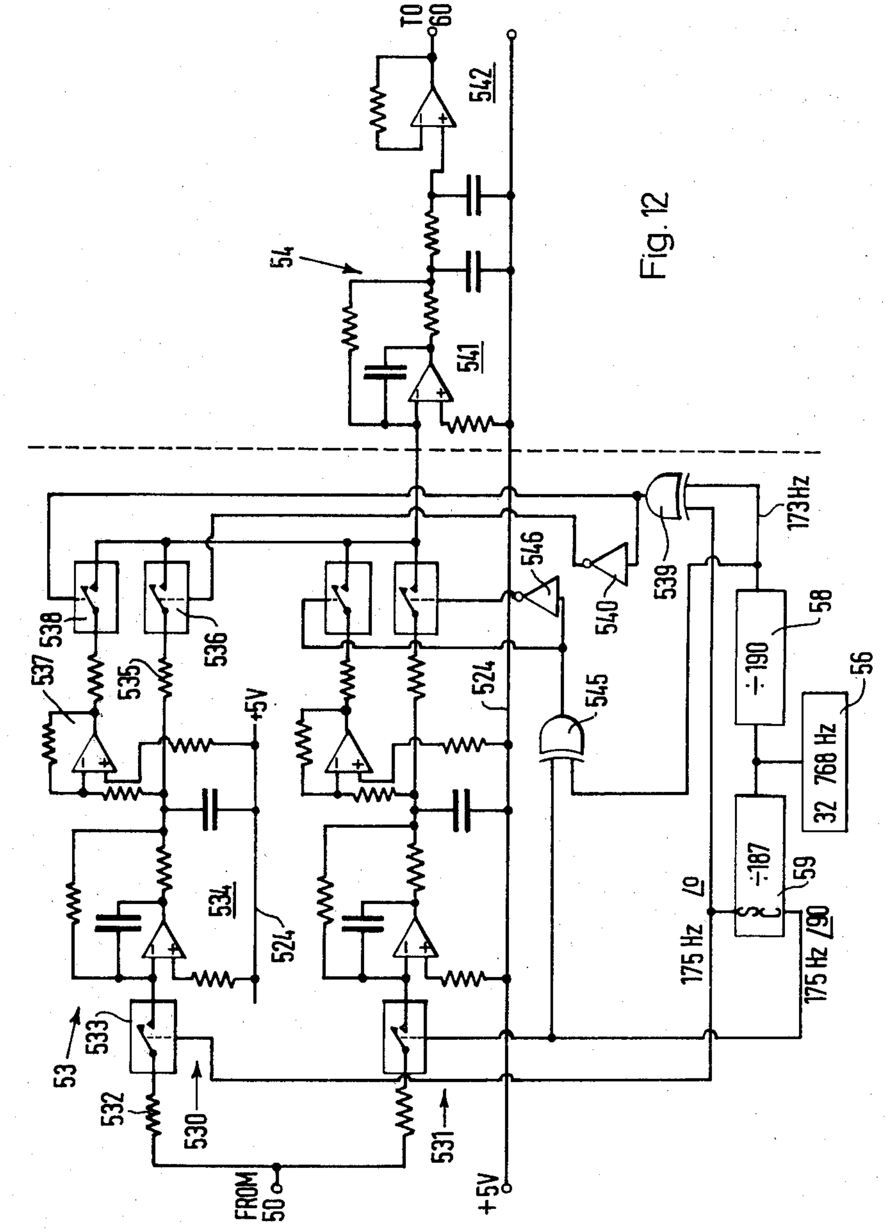

Furthermore, and as shown in FIG. 12, the functions of the switch devices 516, 518 and 521 can be combined in a single stage, designated 53 in FIG. 12.

The stage 53 comprises two parallel signal paths 530 and 531 which are the same in design and operation, so only the path 530 will be described in detail. The input signal from the bandpass filter 50 is supplied via an input resistor 532 to an MOS switch device 533 which is in turn connected to a second-order active low-pass filter 534: these three circuit parts 532 to 534 are the same in function as the parts 512 to 514 in FIG. 11. The d.c. output signal from the filter 534 is supplied both via a resistor 535 to an MOS switch device 536, and via an inverter 537 to another MOS switch device 538. The output signals from the switch devices 536 and 538 and their counterparts in the signal path 531 are summed and supplied to the low-pass filter 54, where any 2½ Hz beat signal is extracted and supplied to the detector 60.

The switch device 533 and its counterpart in the signal path 531 are operated by 175 Hz S and C (quadrature-phase) signals from the divider 59, in the same way as the devices 513 and 517 in FIG. 11. The 175 Hz S signal is also supplied, with the 173 Hz signal from the divider 58, to an exclusive-OR gate 539. The output of the exclusive-OR gate 539 operates the switch device 538 directly, and also operates the switch device 536 via an inverter 540. The corresponding switch devices in the path 531 are coupled to another exclusive-OR gate 545 and an inverter 546 for operation in a similar manner in response to the 173 Hz signal and the 175 Hz C signal.

The exclusive-OR gates 539 and 545 provide a function equivalent to the operation of algebraic multiplication of the 173 Hz and 175 Hz S and C signals from the dividers 58 and 59. Thus, for example, when both signals applied to the gates 539 have the same sign (that is: either low state, representing $-1$; or high state, representing $+1$), that exclusive-OR gate 539 provides a logic-low output which is inverted by the inverter 540 to close the switch device 536 receiving the non-inverted d.c. signal from the low-pass filter in each path 530 and 531. When the 173 Hz and 175 Hz S signals are opposite in sign to one another, the gate 539 provides a logic-high output which closes the switch device 538 receiving the inverted d.c. signal. Thus, the exclusive-OR gate 539, the inverter 540 and the switch devices 536 and 538 which they control in effect multiply the d.c. signals from the low-pass filter 534 by both the 173 Hz and 175 Hz S signals in one operation. The exclusive-OR gate 545 and the inverter 546 operate their associated switch devices in the path 531 to provide similar multiplication by both the 173 Hz and 175 Hz C signals.

It should be noted that the additional bandpass filtering provided by the stages 51,53 is not in any way essential to satisfactory operation of the basic relay shown in FIG. 2. This additional filtering merely exploits further the advantageous features of the basic relay. Thus, for example, the additional, correlation filtering shown in FIGS. 11 and 12 permits some variation in the overall frequency response of the filter network 50 to 54 (by variation of the frequency of the correlation signals operating the switch devices 513, 517 or 533; and by variation of the beat frequency and associated passband of the filter 54), and eliminates insensitivity to signals at 173 Hz; thus, the additional benefits of correlation-type filtering can be obtained without incurring the penalty of delicate adjustment of complex detection circuitry.

In some cases it may be necessary to provide more than two relay units 42 in one ripple-control relay, whereupon the circuitry shown in FIG. 8 is no longer appropriate and cannot be readily extended without incurring excessive power consumption. An alternative circuit for implementing control signals which provides for three relay units, and could be extended further, is shown in FIG. 13.

Figure 13:
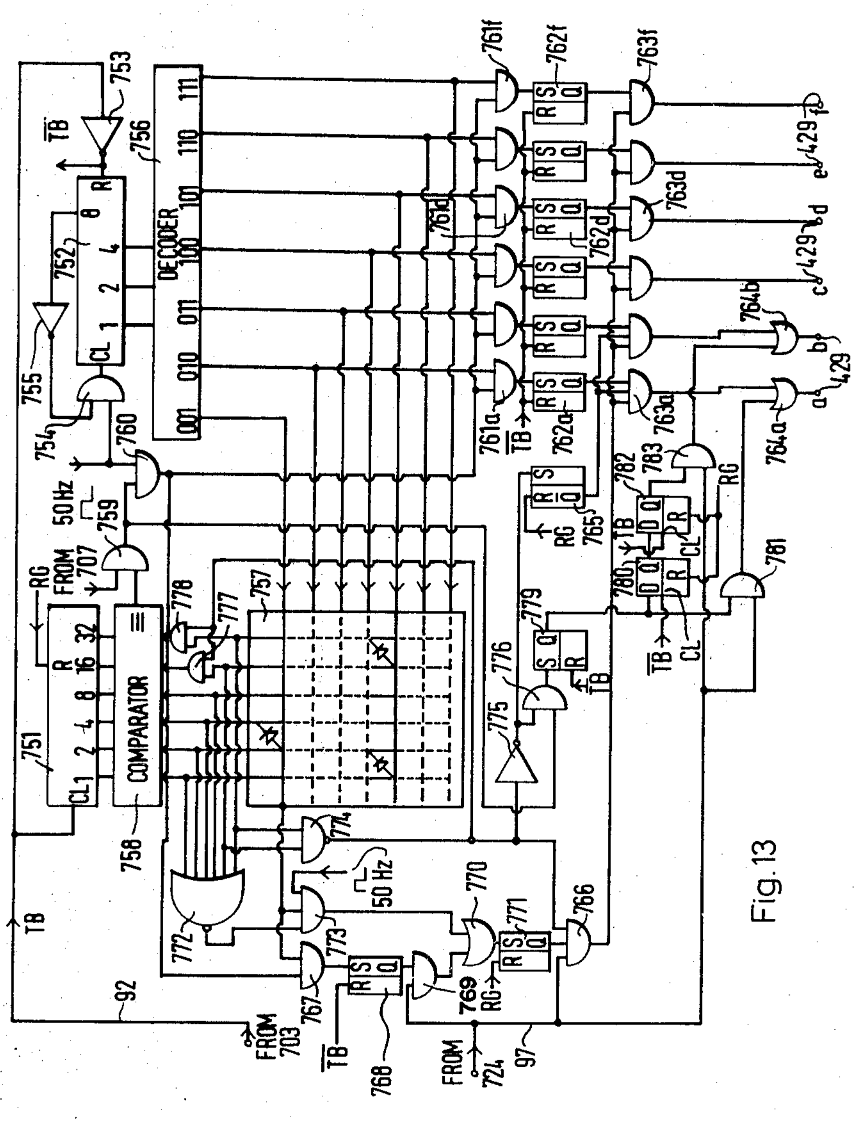

Referring to FIG. 13, the timebase pulses 20, 21 from the bistable circuit 703 are supplied on the line 92 to counters 751 and 752. The counter 751 receives the pulses 20, 21 directly (as indicated by reference TB in FIG. 13) on its clock input, whereas the counter 752 receives the pulses 20, 21 via an inverter 753 (reference $\overline{TB}$ in FIG. 13) on its reset input. The counter 752 also receives the 50 Hz clock pulses at its clock input via an AND-gate 754 which is held open by an inverter 755 until the counter 752 reaches a count of 8. Thus, on the leading edge of each timebase pulse 20, 21 the counter 752 is reset, and then counts 8 successive 50 Hz clock pulses. On the trailing edge of the timebase pulses 20,21 the count in the counter 751 is incremented by 1.

The outputs of the counter 752 are connected to a decoder 756 which energises each of seven output lines 001 to 111 in turn as the counter 752 counts from 1 through to 7. These output lines are coupled to respective inputs (rows) of a diode matrix 757 which stores in binary form the number (from 1 to 40) of each of the time-slots to which the relay is preset to respond. In particular the row 001 to the matrix 757 stores the number of the time-slot for preselection (if any) of the relay; the row 010 stores the number of the time-slot to command closure of the contacts of the first relay unit, and the row 011 stores that for opening its contacts; and the rows 100 to 111 store the numbers of the time-slots to command closure and opening of the second and third relay units respectively. The number stored in each row is defined by the status of six diodes coupling that row to each of six respective outputs (columns) from the diode matrix 757. Thus an intact (conductive) diode represents a binary digit 1, and a open-circuit (non-conductive) diode represents a binary digit 0. The numbers to be stored by each row in the diode matrix 757 are inserted in known manner by supplying a pulse of current to destroy a diode at each digit position which is required to store 0.

The six output lines of the diode matrix 757 are coupled to a comparator 758, for comparison with the count in the counter 751 (the two most significant bits are coupled via AND-gates 777 and 778 whose function will be described later). The output of the comparator 758 is coupled to an AND-gate 759 which also receives the signal on the line 707 from the timebase control circuit 706 (FIG. 7), and blocks any output from the comparator 758 during a starting pulse 20. The output of the AND-gate 759 is coupled to another AND-gate 760, which is opened by each positive-going half-cycle of the 50 Hz clock pulses and is included to ensure that the counter 752 (which counts on each negative-going edge of the clock pulses) has settled before an output from the comparator 758 is implemented.

The output of the AND-gate 760 is coupled to one input of each of six AND-gates **761*a* to 761*f*, the other inputs of which are coupled to respective ones of the outputs 010 to 111 of the decoder 756. The outputs of the gates 761*a* to 761*f* are coupled to the set inputs of six respective bistable circuits 762*a* to 762*f*, the Q outputs of which operate six respective AND-gates 763*a* to 763*f*. These AND-gates 763*a* to 763*f* drive the relay units 42: the gates 763*a* and 763*b* are coupled to the terminals 429*a* and 429*b* via OR-gates 764*a* and 764*b*; the gates 763*c* and 763*d* are coupled directly to the terminals 429*c* and 429*d*; and the gates 763*e* and 763*f* are coupled directly to terminals 429*e* and 429*f*** of a third relay unit 42 which is constructed and operated in the same manner as the first and second relay units 42 shown in FIG. 4.

The AND-gates 763*a* and 763*b* are coupled to receive a signal from the $\overline{Q}$ output of a bistable circuit 765, whose function will be explained later. All six AND-gates 763 also receive a signal from an AND-gate 766, which gates enabling pulses 24 on the line 97 from the bistable circuit 724 in accordance with preselection (if any) of the relay.

The operation of the circuit as so far described will now be explained, ignoring for the present the preselection, if any, of the relay.

Immediately after the leading edge of each timebase pulse 20, 21, the counter 752 counts from 0 to 7, thereby causing each line of the decoder 756 to be energised in turn, to effect scanning of the inputs (rows) of the diode matrix 757. Consequently, each of the binary numbers stored in the diode matrix 757 is presented in turn on the outputs of the matrix 757 for comparison with the current count in the counter 751. Since the counter 752 is clocked at 50 Hz, this scanning of the matrix 757 is completed within about 160 milliseconds, at the beginning of each 1860-millisecond timebase pulse 21 (the effect of the AND-gate 759 is to override operation of the curcuit during a starting pulse 20).

If the number in the counter 751 equals one of the stored numbers in the diode matrix 757, the comparator 758 provides an output signal. For example, the number stored in the fifth row of the diode matrix is 100010 (decimal 34). Thus, at the start of the 34th timebase pulse 20, when the line 101 of the decoder 756 is energised, the comparator 758 will provide an output signal which is passed by the AND-gates 759 and 760 to the AND-gates 761, of which only the AND-gate 761*d* (coupled to the decoder line 101) is open. Consequently, the bistable circuit 762*d* will be set during the 34th time slot in each train of ripple-voltage signals that is received by the relay.

The setting of the bistable circuit 762*d* opens the AND-gate 763*d*, so that, if an enabling pulse 24 is received via the AND-gate 766 during the 34th timebase pulse 20 (as a result of transmission of a ripple-voltage signal on the mains network during the 34th time-slot after the starting pulse), the terminal 429*d* is energised, thereby opening the contacts of the second relay unit 42. At the beginning of the following timebase pulse 20, the bistable circuit 762*d* is reset ($\overline{TB}$).

To provide for preselection, the output of the AND-gate 760 is also coupled to an AND-gate 767, which is energised at a second input by the line 001 from the decoder 756. The output of the gate 767 is connected to the set input of a bistable circuit 768, the Q output of which is connected to another AND-gate 769. The AND-gate 769 is also coupled to the line 97 to receive enabling pulses 24, which it can supply via an OR-gate 770 to set a bistable circuit 771, the Q output of which is coupled to an input of the AND-gate 766.

In the circuit shown in FIG. 13, the first row (for preselection of the diode matrix 757 stores the binary number 000100 (decimal 4). Thus, when the decoder line 001 is energised during the fourth timebase pulse 20, the AND-gate 767 receives input signals from the line 001 and from the comparator 758 (via the AND-gate 759 and 760). Consequently the bistable circuit 768 is set, thereby opening the AND-gate 769. If an enabling pulse 24 occurs during the fourth timebase pulse (that is, the necessary ripple voltage pulse is transmitted to effect preselection of the relay), this enabling pulse 24 is operative via the AND-gate 769 and the OR-gate 770, to open the AND-gate 766 for the passage of further enabling pulses 24 to operate the relay units 42 as described earlier.

If no preselection is required, the first row of the diode matrix 757 is arranged to store 000000. This is detected, during energisation of the line 001 of the decoder 756, by a NOR-gate 772 coupled to all six output lines of the diode matrix 757. The output of this NOR-gate 772 is coupled to an AND-gate 773, which also receives inputs from the line 001 and the 50 Hz clock pulses. Thus, when the preselection code is 000000, the output of the NOR-gate 772 is at logic-high so, during energisation of the line 001, the AND-gate 773 is opened, thereby setting the bistable circuit 771 via the OR-gate 770 and opening the AND-gate 766.

As an additional facility, it is possible to operate the first relay unit 42 in a different manner from the other two relay units 42. To this end, a NAND-gate 774 is coupled to the two most-significant output lines of the diode matrix 757. If these lines carry the binary digits 11 (which do not occur during normal counting of the counter 751 between 0 and 41), the NAND-gate 774 provides a logic-low output. This has three effects: it disables the AND-gate 766, thereby preventing enabling pulses 24 from reaching any of the relay units 42 via this AND-gate 766 in the manner described above; via an inverter 775 it opens an AND-gate 776, and sets the bistable circuit 765 thereby closing the AND-gates 763*a* and 763*b* associated with the first relay unit 42; and it closes the two AND-gates 777 and 778 which normally couple the most significant outputs of the diode matrix 757 to the comparator 758. The AND-gate 776 receives any output signal from the comparator 752 via the AND-gate 759 (thereby bypassing the preselection circuitry), and its output is coupled to the set input of a bistable circuit 779, the Q output of which is coupled to a D-type bistable circuit 780 and an AND-gate 781. The Q output of the bistable circuit 780 is coupled via a second D-type bistable circuit 782 to another AND-gate 783. The AND-gate 781 is coupled via the OR-gate 764*a* to the terminal 429*a*, and the AND-gate 783 is coupled via the OR-gate 764*b* to the terminal 429*b*, and both these AND-gates 781 and 783 receive enabling pulses on the line 97.

Thus, when the two most significant bits supplied by the diode matrix 757 are 11, the comparator 758 actually receives 00. If the other four bits correspond to the number in the counter 751 (which number must be between 1 and 15), the comparator supplies an output signal which sets the bistable circuit 779 via the AND-gates 759 and 776. The AND-gate 781 is thus opened, so that any enabling pulse 24 which is then received can energise the terminal 429*a* to close the contacts of the first relay unit 42. At the end of the associated timebase pulse 20, the D-type bistable circuit 780 is clocked, thereby setting the D-type bistable circuit 782 and opening the AND-gate 783 at the beginning of the following timebase pulse 20. Any enabling pulse 24 occurring during that timebase pulse 20 can thus energise the terminal 429*b* to open the contacts of the first relay unit 42. In this way, the coding of both the close and open commands for the first relay unit 42 (in successive time-slots) is effected with a single code in the diode matrix 757.

The operation of the second and third relay units 42, with preselection if required, can still be effected as previously described when the first relay unit is operated in this alternative manner. However, if only one relay unit 42 is required, it is possible to omit the diode matrix 757 and permanently patch the desired code for relay-contact closure on the vacated inputs to the comparator 758. In this case, the two most significant digit inputs are patched 11. The code for relay-contact opening is automatically implemented, as described above, as the closure code plus one.

By making the diode matrix separate from the rest of the circuit, which is conveniently part of the LSI integrated circuit mentioned earlier, it is possible to change the coding of a particular relay merely by substituting one pre-coded diode matrix for another.

I claim:

1. A remotely-controllable relay for effecting a switching operation in response to a control signal in the form of an alternating ripple voltage at a first predetermined frequency superimposed upon and asynchronous with an alternating power supply voltage in an electric-power distribution network, comprising:

an input for receiving the network voltage and supplying a signal derived therefrom;

means for generating a signal at a second predetermined frequency independent of the power supply frequency and selected to be different from the nominal value of said first frequency and further selected such that the difference frequency of the first and second frequencies is less than any of the first, second and power supply frequencies;

means connected for receiving and mixing said second-frequency signal and said signal supplied by the input, whereby to produce an output signal including, if said control signal is present on the network, a component at the difference frequency;

filter means connected to receive the output signal of the mixing means, and arranged to pass said difference frequency and to attenuate higher frequencies; and means connected to the filter means to detect the presence of said component and to effect said switching operation in accordance therewith.

2. A relay according to claim 1, wherein the filter means comprises a low-pass filter which substantially blocks all frequencies, including the first, second and power supply frequencies, above the said difference frequency.

3. A relay according to claim 2, wherein the filter means comprises a third-order active filter.

4. A relay according to claim 1, wherein the input includes a band-pass filter arranged to attenuate the power supply frequency and at least the odd harmonics thereof relative to said first predetermined frequency.

5. A relay according to claim 1, wherein the mixing means comprises a single multiplying means connected between said input and said filter means, said single multiplying means connected to receive and multiply together said second-frequency signal and said signal supplied by the input.

6. A relay according to claim 5, wherein the multiplying means comprises switch means coupling said input and said filter means, and responsive to said second-frequency signal to open and close once during each cycle of said signal.

7. A relay according to claim 1, wherein the mixing means includes means for effecting tuned filtering at said first predetermined frequency.

8. A relay according to claim 7, wherein the said mixing means includes a tuned filter.

9. A relay according to claim 1, wherein said second predetermined frequency is lower than said first frequency.

10. A relay according to claim 1, wherein the detection means is arranged to compare any difference frequency signal passed by the filter means with a predetermined threshold, and to detect said component corresponding to a control signal as being present if the amplitude of the difference-frequency signal exceeds the threshold for a period of predetermined duration.

11. A relay according to claim 10, wherein the detection means is arranged to compare the instantaneous magnitude of said difference-frequency signal with two reference magnitudes which are respectively positive and negative of the mean value of the difference-frequency signal, and to detect said component as being present, if, within said period, said instantaneous magnitude at least equals each of said reference magnitudes.

12. A relay according to claim 11, wherein said component is detected as being present only if said instantaneous magnitude at least equals one of said reference magnitudes both before and after it at least equals the other said reference magnitude.

13. A relay according to claim 1, wherein the difference frequency is not greater than 20 Hz.

14. A relay according to claim 13 wherein the difference frequency is approximately $2\frac{1}{2}$ Hz.

15. A remotely-controllable relay for effecting a switching operation in response to a control signal in the form of an alternating ripple voltage at a first predetermined frequency superimposed upon and asynchronous with an alternating power supply voltage in an electric-power distribution network, comprising:

an input for receiving the network voltage and supplying a signal derived therefrom;

means for generating a signal at a second predetermined frequency independent of the power supply frequency and selected to be different from the nominal value of said first frequency and further selected such that the difference frequency of the first and second frequencies is less than any of the first, second and power supply frequencies;

means connected for receiving and mixing said second-frequency signal and said signal supplied by the input, whereby to produce an output signal including, if said control signal is present on the network, a component at the difference frequency;

filter means connected to receive the output signal of the mixing means, and arranged to pass said difference frequency and to attenuate higher frequencies;

means connected to the filter means to detect the presence of said component and to effect said switching operation in accordance therewith, and wherein said relay further includes:

means for generating first and second correlation signals at said first predetermined frequency and in phase quadrature with one another, wherein said mixing means is arranged to effect tuned filtering at said first predetermined frequency and comprises first and second multiplying means connected to receive and multiply said signal supplied by the input with said first and second correlation signals respectively;

first and second low-pass filters connected to receive the outputs from said first and second multiplying means respectively; and third multiplying means connected to receive and multiply the outputs from said first and second low-pass filters respectively by first and second multiplying factors dependent on said generated first and second frequency signals and in the same phase relationship as said first and second correlation signals.

16. A relay according to claim 15 wherein said first and second multiplying means comprise respective switch means which couple said input and said first and second low-pass filters respectively, and which are responsive to said first and second correlation signals respectively to open and close once during each cycle of said signals.

17. A relay according to claim 15, wherein said third multiplying means is arranged to multiply the outputs from said first and second low-pass filters respectively by respective signals at a selected one of said first and second frequencies and in the same phase relationship as said first and second correlation signals, and to multiply the sum of the products thereof by a signal at the other of said frequencies.

18. A relay according to claim 17, wherein said third multiplying means is arranged to multiply the outputs from said first and second low-pass filters respectively by said first and second correlation signals respectively and to multiply the sum of the products thereof by said second-frequency signal.

19. A relay according to claim 18, wherein said third multiplying means comprises three switch means, a first and second of which couple said first and second low-pass filters respectively to the third switch means which is coupled to said filter means, and said first, second and third switch means being responsive to said first correlation signal, said second correlation signal and said second-frequency signal respectively to open and close once during each cycle of said signals.

20. A relay according to claim 15, wherein said third multiplying means is arranged to multiply the outputs from said first and second low-pass filters respectively by respective signals derived from algebraic multiplication of said second-frequency signal with said first and second correlation signals respectively.

21. A relay according to claim 20, wherein said third multiplying means comprises four switch means and two exclusive-OR gates, a first and second of the switch means coupling said first and second low-pass filters respectively via inverters to said filter means and a third and fourth of the switch means coupling said first and second low-pass filters respectively directly to said filter means, a first of the exclusive-OR gates being responsive to said first correlation signal and said second-frequency signal and the second exclusive-OR gate being responsive to said second correlation signal and said second-frequency signal, and said first and third switch means being responsive to, respectively, the signal from said first exclusive-OR gate and the inverse thereof, and said second and fourth switch means being responsive to, respectively the signal from said second exclusive-OR gate and the inverse thereof.

* * * * *

Carbostyril derivative or a pharmaceutically acceptable acid addition salt thereof, having excellent platelate aggregation inhibitory effect, calcium antagonism, hypotensive effect and phosphodiesterase inhibitory effect are useful as prophylactic or treating agents for thrombosis, circulation improving agents for coronary blood flow such as coronary vasodilators, hypotensive agents and phosphodiesterase inhibitors. Furthermore, the carbostyril derivatives are weak in heart rate increasing activity and also in cardiac muscle contraction increasing activity, and the carbostyril derivatives are useful

8 PT.

Carbostyril derivative or a pharmaceutically acceptable acid addition salt thereof, having excellent platelate aggregation inhibitory effect, calcium antagonism, hypotensive effect and phosphodiesterase inhibitory effect are useful as prophylactic or treating agents for thrombosis, circulation improving agents for coronary blood flow such as coronary vasodilators, hypotensive agents and phosphodiesterase inhibitors. Furthermore, the carbostyril derivatives are weak in heart rate increasing activity and also in cardiac muscle contraction increasing activity, and the carbostyril derivatives are useful

6 PT.

Carbostyril derivative or a pharmaceutically acceptable acid addition salt thereof, having excellent platelate aggregation inhibitory effect, calcium antagonism, hypotensive effect and phosphodiesterase inhibitory effect are useful as prophylactic or treating agents for thrombosis, circulation improving agents for coronary blood flow such as coronary vasodilators, hypotensive agents and phosphodiesterase inhibitors. Furthermore, the carbostyril derivatives are weak in heart rate increasing activity and also in cardiac muscle contraction increasing activity, and the carbostyril derivatives are useful

4 PT.

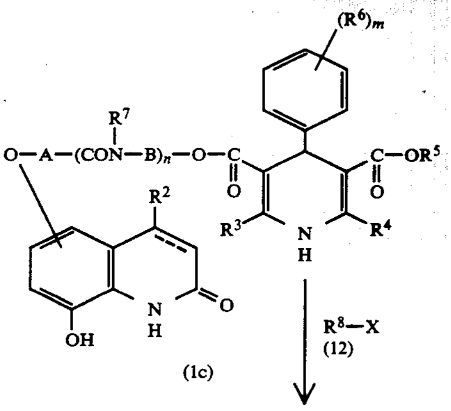

(1c)

$$v'_{ref}(t) = K\,r\,\delta\left(t - \frac{2L - 2d_s}{v_w}\right) + K(1 - r^2)e^{-2\alpha_s d_s}$$

$$\cos\beta^* = \frac{K_2 - n\frac{T'}{v''}}{\sqrt{K_1^2 + \left(K_2 - n\frac{T'}{v''}\right)^2 + K_3^2}}$$

$$(K_1x + K_2y + K_3z + T) + n(K''_1x + K''_2y + K''_3z + T'') = 0$$

are useful as prophylactic or treating agents for thrombosis, circulation improving agents for coronary blood flow such as coronary vasodilators, hypotensive agents and phosphodiesterase inhibitors. Furthermore, the carbostyril derivatives are weak in heart rate increasing activity and also in cardiac muscle contraction increasing activity, and the carbostyril derivatives are useful

8 PT.

Carbostyril derivative or a pharmaceutically acceptable acid addition salt thereof, having excellent platelate aggregation inhibitory effect, calcium antagonism, hypotensive effect and phosphodiesterase inhibitory effect are useful as prophylactic or treating agents for thrombosis, circulation improving agents for coronary blood flow such as coronary vasodilators, hypotensive agents and phosphodiesterase inhibitors. Furthermore, the carbostyril derivatives are weak in heart rate increasing activity and also in cardiac muscle contraction increasing activity, and the carbostyril derivatives are useful

6 PT.

Carbostyril derivative or a pharmaceutically acceptable acid addition salt thereof, having excellent platelate aggregation inhibitory effect, calcium antagonism, hypotensive effect and phosphodiesterase inhibitory effect are useful as prophylactic or treating agents for thrombosis, circulation improving agents for coronary blood flow such as coronary vasodilators, hypotensive agents and phosphodiesterase inhibitors. Furthermore, the carbostyril derivatives are weak in heart rate increasing activity and also in cardiac muscle contraction increasing activity, and the carbostyril derivatives are useful

4 PT.

| $r_1$ ($L_1$) | $r_6$ ($L_3$) | $r_7$ ($L_4$) |
|---|---|---|
| K = 1.0 | K = 1.0 | K = 0.0 |
| $C_2$ = 0.0 | $C_2$ = 0.0 | $C_2$ = 0.0 |
| $C_4$ = −0.15691 × 10−6 | $C_4$ = +0.95381 × 10−7 | $C_4$ = −0.22891 × 10−5 |
| $C_6$ = −0.40068 × 10−10 | $C_6$ = −0.73871 × 10−10 | $C_6$ = +0.12283 × 10−9 |
| $C_8$ = +0.21016 × 10−13 | $C_8$ = +0.12280 × 10−13 | $C_8$ = +0.84230 × 10−13 |
| $C_{10}$ = −0.37685 × 10−17 | $C_{10}$ = −0.33177 × 10−17 | $C_{10}$ = −0.20592 × 10−16 |

$f_1$ = 314.6
$f_2$ = 88.0
$f_3$ = −481.2
$f_4$ = −99.6

100mm

| | | | |
|---|---|---|---|
| = 101.2 Aperture ratio: | 1:1.10 | | |
| agnification of projection: | −7.997x | | |
| alf angle of view: | 28.56° | | |
| 43.454 | $d_1$ = 11.0 | $n_1$ = 1.49380 | $L_1$ |
| -1542.254 | $d_2$ = 68 | | |
| 16.976 | $d_3$ = 20.0 | $n_2$ = 1.62286 | $L_2$ |
| 10.914 | $d_4$ = 2.87 | | |
| -89.375 | $d_5$ = 5.0 | $n_3$ = 1.59501 | $L_3$ |
| -127.071 | $d_6$ = 58.8 | | |
| -48.609 | $d_7$ = 5 | $n_4$ = 1.49380 | $L_4$ |
| ∞ | $d_8$ = 5 | $n_5$ = 1.45000 | S |
| ∞ | $d_9$ = 8 | $n_6$ = 1.51872 | G |

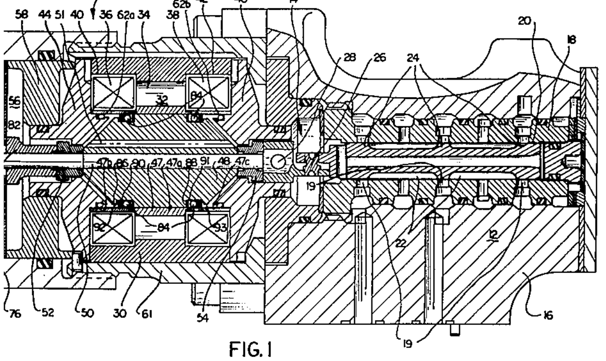

FIG. 1

IMAGE SYSTEM
TEST TARGET
A

U.S. DEPARTMENT OF COMMERCE
PATENT AND TRADEMARK OFFICE

8 PT.

Carbostyril derivative or a pharmaceutically acceptable acid addition salt thereof, having excellent platelate aggregation inhibitory effect, calcium antagonism, hypotensive effect and phosphodiesterase inhibitory effect are useful as prophylactic or treating agents for thrombosis, circulation improving agents for coronary blood flow such as coronary vasodilators, hypotensive agents and phosphodiesterase inhibitors. Furthermore, the carbostyril derivatives are weak in heart rate increasing activity and also in cardiac muscle contraction increasing activity, and the carbostyril derivatives are useful

6 PT.

Carbostyril derivative or a pharmaceutically acceptable acid addition salt thereof, having excellent platelate aggregation inhibitory effect, calcium antagonism, hypotensive effect and phosphodiesterase inhibitory effect are useful as prophylactic or treating agents for thrombosis, circulation improving agents for coronary blood flow such as coronary vasodilators, hypotensive agents and phosphodiesterase inhibitors. Furthermore, the carbostyril derivatives are weak in heart rate increasing activity and also in cardiac muscle contraction increasing activity, and the carbostyril derivatives are useful

4 PT.

Carbostyril derivative or a pharmaceutically acceptable acid addition salt thereof, having excellent platelate aggregation inhibitory effect, calcium antagonism, hypotensive effect and phosphodiesterase inhibitory effect are useful as prophylactic or treating agents for thrombosis, circulation improving agents for coronary blood flow such as coronary vasodilators, hypotensive agents and phosphodiesterase inhibitors. Furthermore, the carbostyril derivatives are weak in heart rate increasing activity and also in cardiac muscle contraction increasing activity, and the carbostyril derivatives are useful

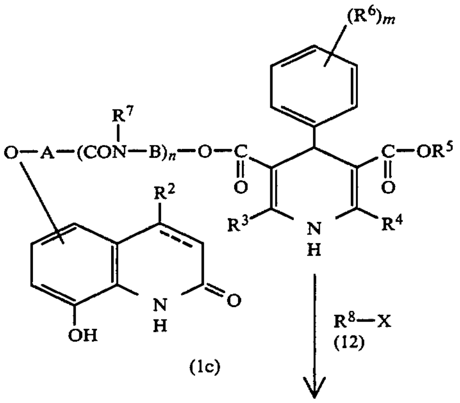

(1c)

$$\cos\beta^* = \frac{K_2 - n\frac{T'}{v''}}{\sqrt{K_1^2 + \left(K_2 - n\frac{T'}{v''}\right)^2 + K_3^2}}$$

$$v'_{ref}(t) = K\, r\, \delta\left(t - \frac{2L - 2d_s}{v_w}\right) + K(1 - r^2)e^{-2\alpha s d s}$$

$$(K_1x + K_2y + K_3z + T) + n(K''_1x + K''_2y + K''_3z + T'') = 0$$

| r1 (L1) | r6 (L3) | r7 (L4) |
|---|---|---|
| K = 1.0 | K = 1.0 | K = 0.0 |
| $C_2$ = 0.0 | $C_2$ = 0.0 | $C_2$ = 0.0 |
| $C_4 = -0.15691 \times 10^{-6}$ | $C_4 = +0.95381 \times 10^{-7}$ | $C_4 = -0.22891 \times 10^{-5}$ |
| $C_6 = -0.40068 \times 10^{-10}$ | $C_6 = -0.73871 \times 10^{-10}$ | $C_6 = +0.12283 \times 10^{-9}$ |
| $C_8 = +0.21016 \times 10^{-13}$ | $C_8 = +0.12280 \times 10^{-13}$ | $C_8 = +0.84230 \times 10^{-13}$ |
| $C_{10} = -0.37685 \times 10^{-17}$ | $C_{10} = -0.33177 \times 10^{-17}$ | $C_{10} = -0.20592 \times 10^{-16}$ |

$f_1 = 314.6$, $f_2 = 88.0$, $f_3 = -481.2$, $f_4 = -99.6$

100mm

| | | | |
|---|---|---|---|
| 1.2 Aperture ratio: | 1:1.10 | | |
| ication of projection: | $-7.997^x$ | | |
| gle of view: | 28.56° | | |
| 4 | $d_1 = 11.0$ | $n_1 = 1.49380$ | $L_1$ |
| 1.254 | $d_2 = 68$ | | |
| 6 | $d_3 = 20.0$ | $n_2 = 1.62286$ | $L_2$ |
| 4 | $d_4 = 2.87$ | | |
| 75 | $d_5 = 5.0$ | $n_3 = 1.59501$ | $L_3$ |
| 071 | $d_6 = 58.8$ | | |
| 09 | $d_7 = 5$ | $n_4 = 1.49380$ | $L_4$ |
| | $d_8 = 5$ | $n_5 = 1.45000$ | S |
| | $d_9 = 8$ | $n_6 = 1.51872$ | G |

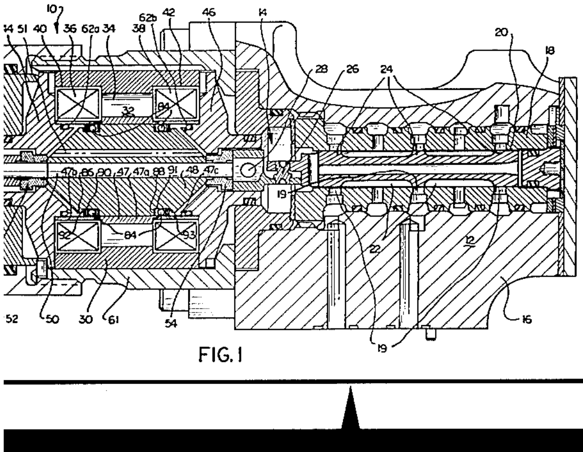

FIG. 1

IMAGE SYSTEM TEST TARGET A

U.S. DEPARTMENT OF COMMERCE
PATENT AND TRADEMARK OFFICE